(12) United States Patent
Hsiao et al.

(10) Patent No.: US 12,713,907 B2
(45) Date of Patent: Aug. 18, 2026

(54) BACK-END-OF-LINE PASSIVE DEVICE STRUCTURE

(71) Applicant: Taiwan Semiconductor Manufacturing Company, Ltd., Hsinchu (TW)

(72) Inventors: Tsung-Chieh Hsiao, Changhua County (TW); Hsiang-Ku Shen, Hsinchu City (TW); Yuan-Yang Hsiao, Hsinchu (TW); Chen-Chiu Huang, Hsinchu (TW); Dian-Hau Chen, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 207 days.

(21) Appl. No.: 18/784,616

(22) Filed: Jul. 25, 2024

(65) Prior Publication Data

US 2024/0379531 A1 Nov. 14, 2024

Related U.S. Application Data

(60) Continuation of application No. 18/447,722, filed on Aug. 10, 2023, now Pat. No. 12,444,674, which is a (Continued)

(51) Int. Cl.

| | |
|---|---|
| ***H10W 20/42*** | (2026.01) |
| ***H10D 1/68*** | (2025.01) |
| ***H10W 20/40*** | (2026.01) |

(52) U.S. Cl.

CPC .......... *H10W 20/496* (2026.01); *H10D 1/696* (2025.01); *H10D 1/714* (2025.01); *H10D 1/716* (2025.01)

(58) Field of Classification Search

CPC ........ H10D 1/696; H10D 1/714; H10D 1/716; H10W 20/496; H10W 20/42; H10W 20/083

See application file for complete search history.

(56) References Cited

U.S. PATENT DOCUMENTS

| | | | | |
|---|---|---|---|---|
| 2013/0270675 A1* | 10/2013 | Childs | H10W 20/42 | 257/532 |
| 2019/0148072 A1* | 5/2019 | Fox, III | H01G 4/005 | 361/301.4 |

(Continued)

FOREIGN PATENT DOCUMENTS

| | | |
|---|---|---|
| TW | 201351484 A | 12/2013 |
| TW | I744281 B | 11/2021 |

*Primary Examiner* — Omar F Mojaddedi

(74) *Attorney, Agent, or Firm* — HAYNES AND BOONE, LLP

(57) ABSTRACT

A device structure according to the present disclosure includes a passivation layer, a first conductor plate layer disposed on the passivation layer, a second conductor plate layer disposed over the first conductor layer, a third conductor plate layer disposed over the second conductor layer, and a fourth conductor plate layer disposed over the third conductor layer. The second conductor plate layer encloses the first conductor plate layer and the fourth conductor plate layer encloses the third conductor plate layer. The device structure, when used in a back-end-of-line passive device, reduces leakage and breakdown due to corner discharge effect.

20 Claims, 14 Drawing Sheets

Related U.S. Application Data division of application No. 17/586,287, filed on Jan. 27, 2022, now Pat. No. 11,990,401.

(60) Provisional application No. 63/285,820, filed on Dec. 3, 2021.

(56) References Cited

U.S. PATENT DOCUMENTS

| | | | | |
|---|---|---|---|---|
| 2019/0165188 | A1* | 5/2019 | Chang | H10D 1/66 |
| 2019/0305078 | A1* | 10/2019 | Wu | H10D 1/042 |
| 2020/0006183 | A1* | 1/2020 | Huang | H10W 74/147 |
| 2020/0211955 | A1* | 7/2020 | Rubin | H10D 1/692 |
| 2021/0098399 | A1 | 4/2021 | Huang | |
| 2021/0249350 | A1 | 8/2021 | Shen | |
| 2021/0265262 | A1 | 8/2021 | Hsiao | |
| 2021/0376058 | A1 | 12/2021 | Shen | |
| 2022/0384563 | A1* | 12/2022 | Kim | H10D 1/694 |

* cited by examiner

W2>W4>W1>W3

W4>W2>W1>W3

W2>W4>W3>W1

W4>W2>W3>W1

W2=W4>W1>W3

W2=W4>W3>W1

W2>W4>W3=W1

W4>W2>W3=W1

W2=W4>W3=W1

X
Y
Z

W1>W3>W2>W4

W1>W3>W4>W2

W3>W1>W2>W4

W3>W1>W4>W2

W1=W3>W2>W4

W1=W3>W4>W2

W1>W3>W2=W4

W3>W1>W2=W4

W1=W3>W2=W4

X
Y
Z

X
Y
Z

404
D5
D4
D3
D2
D1
402
S
S
S
S
S
C6
C5
C4
C3
C2
C1

X
Y
Z
404
D5
D4
D3
D2
D1
402
S
S
S
S
S
S
C6
C5
C4
C3
C2
C1

BACK-END-OF-LINE PASSIVE DEVICE STRUCTURE

PRIORITY DATA

The present application is a continuation application of U.S. patent application Ser. No. 18/447,722, filed Aug. 10, 2023, which is a divisional application of U.S. patent application Ser. No. 17/586,287, filed Jan. 27, 2022, which claims the benefit of U.S. Provisional Application No. 63/285,820, filed Dec. 3, 2021, each of which is incorporated herein by reference in its entirety.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

As the geometry size of IC devices decreases, passive devices that require large surface areas are moved to back-end-of-line (BEOL) structures. Metal-Insulator-Metal (MIM) capacitors are among examples of such passive devices. A typical MIM capacitor includes multiple conductor plate layers that are insulated from one another by multiple insulator layers. Although existing MIM structures are generally adequate for their intended purposes, they are not satisfactory in every aspect.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
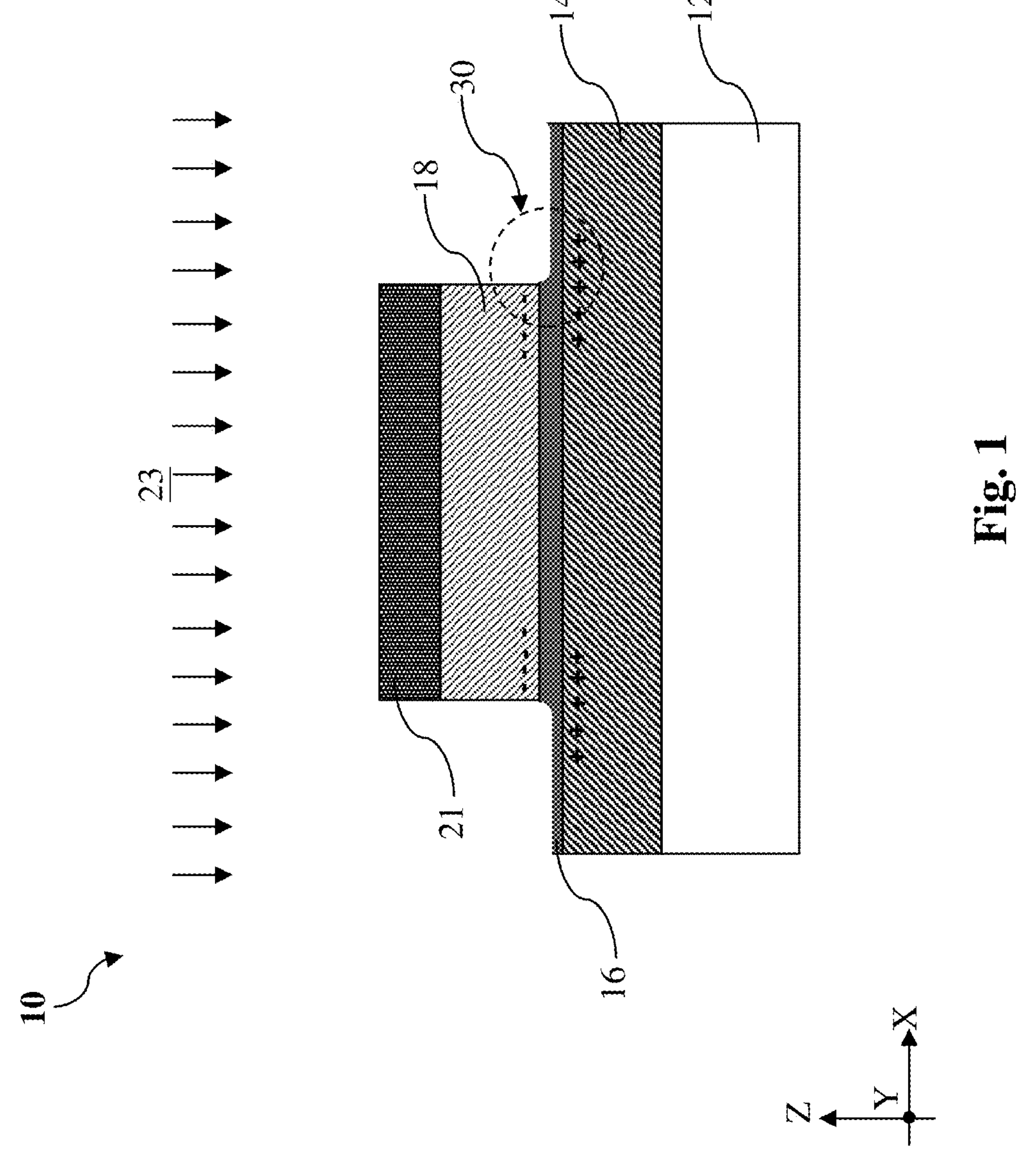
FIG. 1 is a schematic cross-sectional view of a device structure to illustrate how patterning of an upper conductor plate layer may damage an insulator layer over a lower conductor plate layer.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Further, when a number or a range of numbers is described with "about," "approximate," and the like, the term is intended to encompass numbers that are within a reasonable range considering variations that inherently arise during manufacturing as understood by one of ordinary skill in the art. For example, the number or range of numbers encompasses a reasonable range including the number described, such as within +/−10% of the number described, based on known manufacturing tolerances associated with manufacturing a feature having a characteristic associated with the number. For example, a material layer having a thickness of "about 5 nm" can encompass a dimension range from 4.25 nm to 5.75 nm where manufacturing tolerances associated with depositing the material layer are known to be +/−15% by one of ordinary skill in the art. Still further, the present disclosure may repeat reference numerals and/or letters in the various examples. This repetition is for the purpose of simplicity and clarity and does not in itself dictate a relationship between the various embodiments and/or configurations discussed.

Metal-Insulator-Metal (MIM) capacitors have been widely used in functional circuits such as mixed signal circuits, analog circuits, Radio Frequency (RF) circuits, Dynamic Random Access Memories (DRAMs), embedded DRAMs, and logic operation circuits. In system-on-chip (SOC) applications, different capacitors for different functional circuits have to be integrated on a same chip to serve different purposes. For example, in mixed-signal circuits, capacitors are used as decoupling capacitors and high-frequency noise filters. For DRAM and embedded DRAM circuits, capacitors are used for memory storage, while for RF circuits, capacitors are used in oscillators and phase-shift networks for coupling and/or bypassing purposes. For microprocessors, capacitors are used for decoupling. As its name suggests, an MIM capacitor includes a sandwich structure of interleaving metal layers and insulator layers. An example MIM capacitor includes a plurality of conductor plate layers, each of which is insulated from an adjacent conductor plate layer by an insulator layer. As an MIM capacitor is fabricated in a BEOL structure to have a larger surface area, its conductor plate layers extend over multiple underlying top metal contact features that are connected to logic or control circuitry.

Formation and structures of MIM capacitors are not without challenges. For example, patterning of an upper conductor plate layer may damage an insulator layer disposed on an underlying lower conductor plate layer, creating possible leakage paths. For another example, when two adjacent conductor plate layers are of different dimensions, an upper conductor plate layer may conform to a profile of a lower conductor plate layer to form a step shape. Electrostatic stresses tend to be concentrated at or near edges of the step shape where the local electrical field is greater. The step shape therefore may lead to reduced time-dependent-dielectric-breakdown (TDDB) reliability. Generally speaking, a wider-bottom-narrower-top (BT) conductor plate structure tends to suffer increased leakage due to patterning of the narrow top conductor plate and a wider-top-narrower-bottom (TB) conductor plate structure tends to suffer reduced TDDB reliability.

The schematic cross-sectional view of a device structure 10 in FIG. 1 illustrates why a BT conductor plate structure is more likely to suffer increased leakage. The device structure 10 in FIG. 1 includes a passivation layer 12, a first conductor plate layer 14 disposed on the passivation layer 12, a first insulator layer 16 disposed on the first conductor plate layer 14, a second conductor plate layer 18 disposed on the first insulator layer 16, and a hard mask layer 21 for patterning of the second conductor plate layer 18. In some instances, after the first insulator layer 16, the second conductor plate layer 18, and the hard mask layer 21 are sequentially deposited over the first conductor plate layer 14, the second conductor plate layer 18 is patterned such that the underlying first conductor plate layer 14 is not completely vertically covered by the second conductor plate layer 18. The patterning may be performed by etching the device structure 10 with a directional etch process 23. In some embodiments, the passivation layer 12 may include silicon oxide, undoped silica glass (USG), or other suitable dielectric materials, the first conductor plate layer 14 and the second conductor plate layer 18 may include titanium nitride or tantalum nitride, the first insulator layer 16 may include a high-k dielectric material, and the hard mask layer 21 may include silicon oxide, silicon nitride, or a combination thereof. The high-k dielectric material for the first insulator layer 16 may include hafnium oxide, hafnium aluminum oxide, hafnium zirconium oxide, zirconium oxide, zirconium aluminum oxide, aluminum oxide, silicon nitride, or a combination thereof. The directional etch process 23 may include a dry etch process, such as a reactive-ion-etching (RIE). The directional etch process 23 may include use of oxygen ($O_2$), nitrogen ($N_2$), a fluorine-containing gas (e.g., $CF_4$, $NF_3$, $SF_6$, $CH_2F_2$, $CHF_3$, and/or $C_2F_6$), a hydrocarbon (e.g. methane), a chlorine-containing gas (e.g., $Cl_2$, $CHCl_3$, $CCl_4$, and/or $BCl_3$), a bromine-containing gas (e.g., HBr and/or $CHBr_3$), an iodine-containing gas, other suitable gases and/or plasmas, and/or combinations thereof.

As shown in FIG. 1, to ensure satisfactory patterning of the second conductor plate layer 18 without any undesirable residues, the directional etch process 23 may be allowed to etch partially into the first insulator layer 16. That is, portions of the first insulator layer 16 not covered by the second conductor plate layer 18 and the hard mask layer 21 may be etched by the directional etch process 23 to have a smaller thickness than the covered portions. When the control of the directional etch process 23 is less than perfect, the directional etch process 23 may substantially etch though the first insulator layer 16 during the patterning process. Additionally, after the patterning, the lower edges of the second conductor plate layer 18 may have stronger electric field. The thinner first insulator layer 16 near the edge of the second conductor plate layer 18, in combination with the stronger electric field near the edges of the second conductor plate layer 18, may lead to leakage through the first insulator layer 16.

Figure 2:
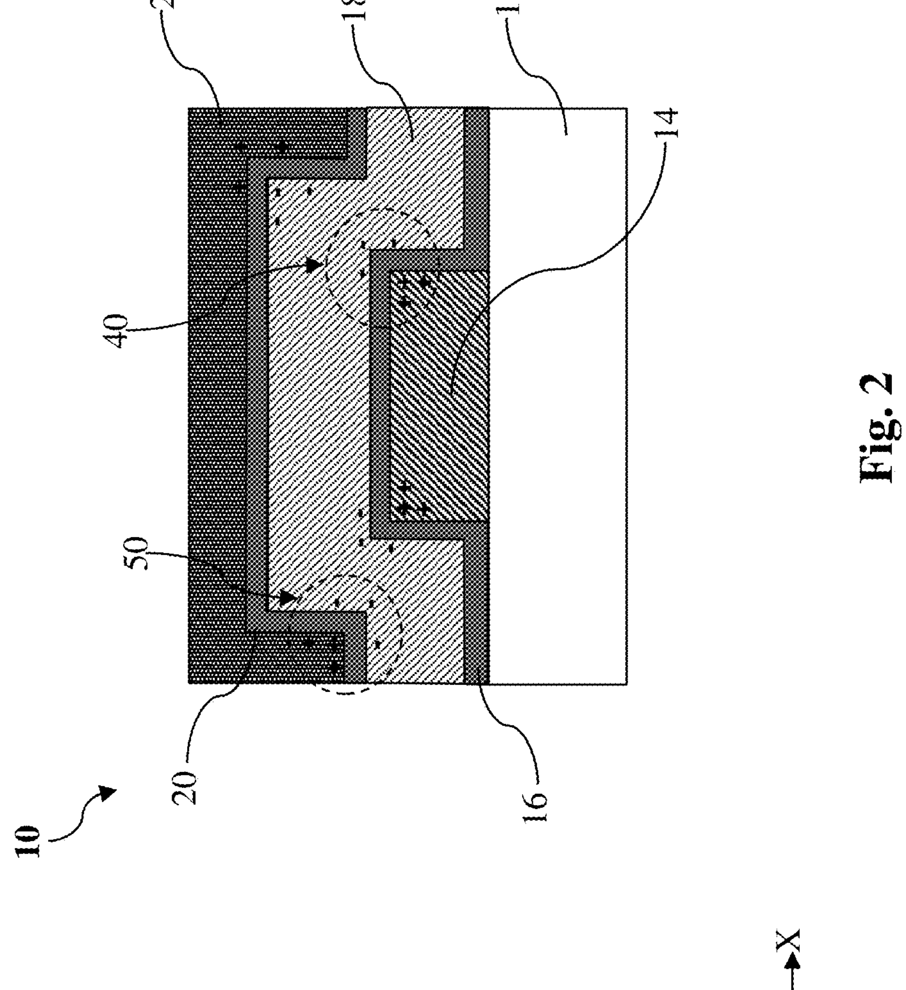
FIG. 2 is a schematic cross-sectional view of a device structure to illustrate where corner discharge is likely to take place.

The schematic cross-sectional view of a device structure 10 in FIG. 2 illustrates why TB conductor plate structure is more likely to have lower TDDB reliability. The device structure 10 in FIG. 2 includes a passivation layer 12, a first conductor plate layer 14 disposed on the passivation layer 12, a first insulator layer 16 disposed on the first conductor plate layer 14, a second conductor plate layer 18 disposed on the first insulator layer 16, a second insulator layer 20 disposed on the second conductor plate layer 18, and a third conductor plate layer 22 disposed on the second insulator layer 20. In some embodiments, the passivation layer 12 may include silicon oxide, undoped silica glass (USG), or other suitable dielectric materials. The first conductor plate layer 14, the second conductor plate layer 18 and the third conductor plate layer 22 may include titanium nitride or tantalum nitride. The first insulator layer 16 and the second insulator layer 20 may include a high-k dielectric material, such as hafnium oxide, hafnium aluminum oxide, hafnium zirconium oxide, zirconium oxide, zirconium aluminum oxide, aluminum oxide, silicon nitride, or a combination thereof. In one embodiments, they may include hafnium oxide.

As shown in FIG. 2, because each of the first insulator layer 16, the second conductor plate layer 18, the second insulator layer 20, and the third conductor plate layer 22 is conformally deposited after an underlying layer is deposited and patterned, step or step-like shapes may be formed right at where an overlying layer wraps over an edge of the underlying layer. These step shapes may result in corners where the local electric fields are intensified. As illustrated in FIG. 2, the corners may include outward pointing corners such as an outward pointing corner 40 and inward pointing corners such an inward point corner 50. These local intensified electric fields are results of charge accumulation at the corners. Over time, the corner discharge driven by greater electric fields may cause breakdown of the first insulator layer 16 or the second insulator layer 20, which may lead to unsatisfactory time-dependent-dielectric breakdown (TDDB) reliability of the first insulator layer 16 or the second insulator layer 20.

The present disclosure provides a device structure to minimize leakage and TDDB. The device structures of the present disclosure may be described as odd-number-layer-enclosure, even-number-layer-enclosure, or a hybrid thereof. Odd-number-layer-enclosure and even-number-layer-enclosure can be better understood using an MIM structure with four conductor plate layers. In odd-number-layer-enclosure, the odd-numbered conductor plate layer encloses an overlying even-numbered conductor plate layer. That is, the bottommost first conductor plate layer is larger than the overlying second conductor plate layer such that an outer edge of the first conductor plate layer encloses an outer edge of the second conductor plate layer. The third conductor plate layer is larger than the overlying fourth conductor plate layer such that an outer edge of the third conductor plate layer encloses an outer edge of the fourth conductor plate layer. In even-numbered-layer-enclosure, the even-numbered conductor plate layer encloses an underlying odd-numbered conductor plate layer. That is, the topmost fourth conductor plate layer is larger than the underlying third conductor plate layer such that an outer edge of the fourth conductor plate layer encloses an outer edge of the third conductor plate layer. The second conductor plate layer is larger than the underlying first conductor plate layer such that an outer edge of the second conductor plate layer encloses an outer edge of the first conductor plate layer. A hybrid of odd-number-layer-enclosure and even-number-layer-enclosure may include one conductor plate layer that is an exception or an outlier of the odd-number-layer-enclosure or even-number-layer-enclosure configuration.

Figure 3:
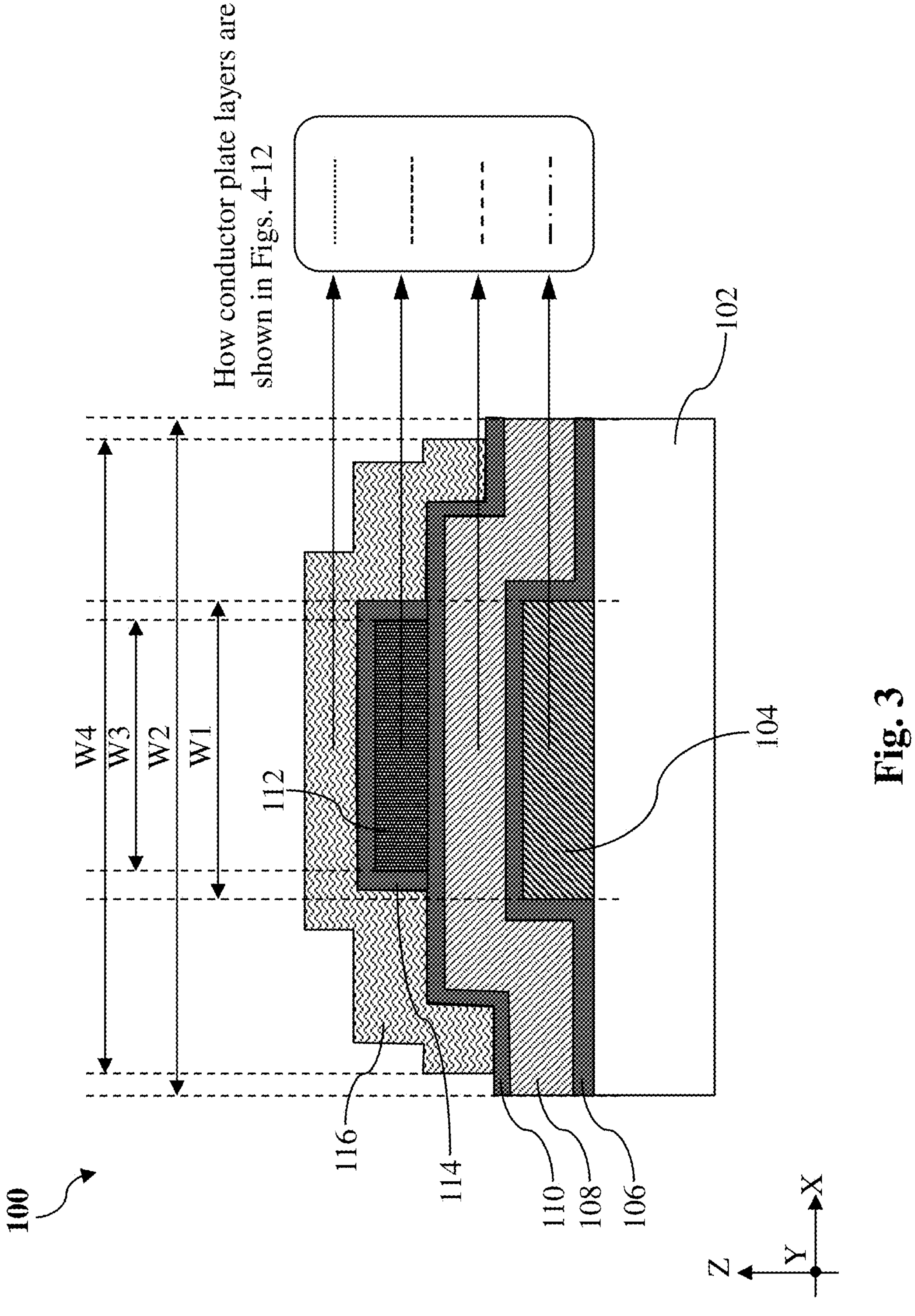
FIGS. 3-44 illustrate fragmentary cross-sectional views or top views of device structures, according to one or more aspects of the present disclosure.
Figures 4, 5, 6, 7, 8, 9, 10, 11, 12:
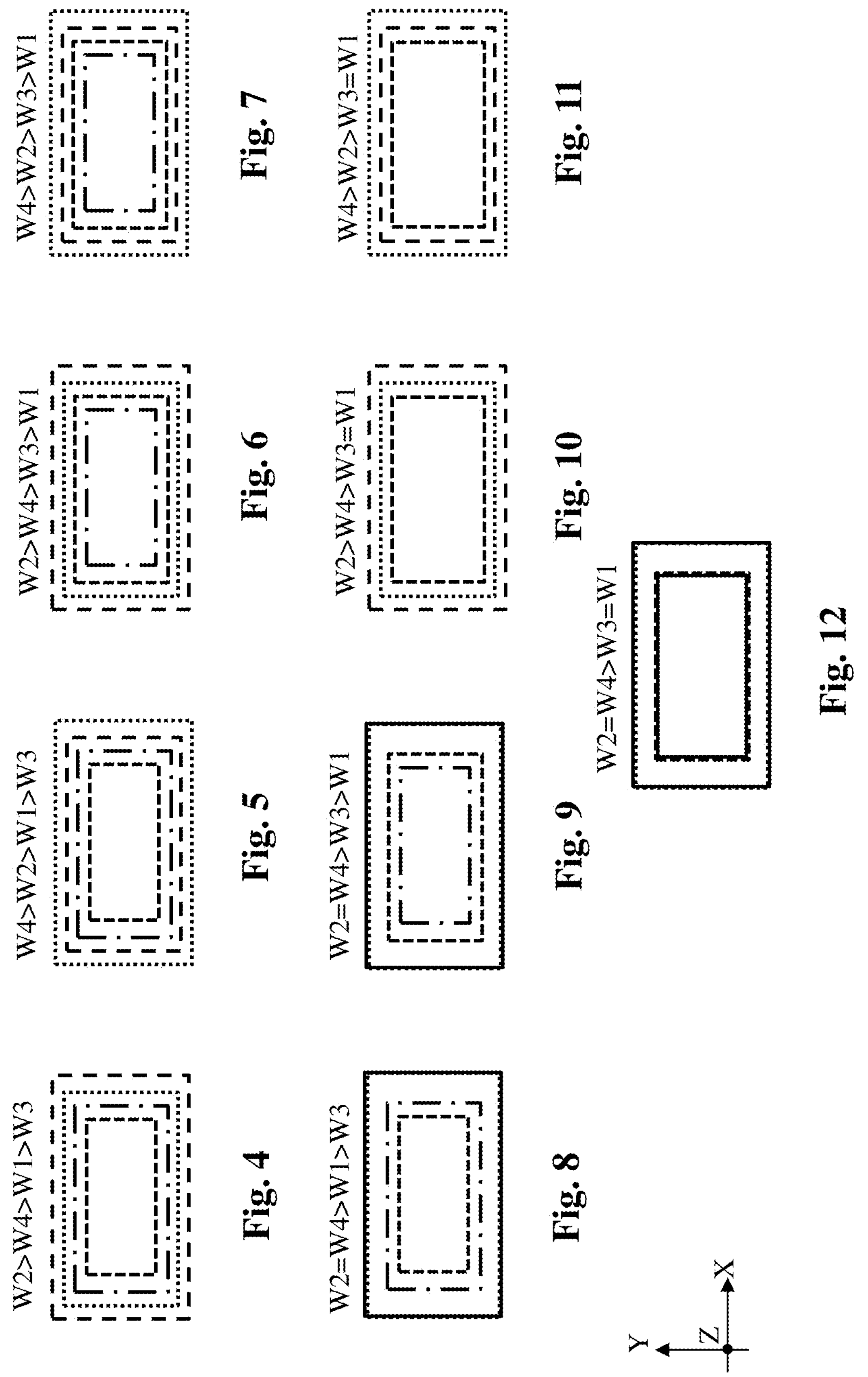

FIG. 3 illustrates a device structure 100 that follows the even-number-layer-enclosure configuration. The device structure 100 in FIG. 3 includes a passivation layer 102, a first conductor plate layer 104 disposed on the passivation layer 102, a first insulator layer 106 disposed on the first conductor plate layer 104, a second conductor plate layer 108 disposed on the first insulator layer 106, a second insulator layer 110 disposed on the second conductor plate layer 108, a third conductor plate layer 112 disposed on the second insulator layer 110, a third insulator layer 114 disposed on the third conductor plate layer 112, and a fourth conductor plate layer 116 disposed on the third insulator layer. In some embodiments, the passivation layer 102 may include silicon oxide, undoped silica glass (USG), or other suitable dielectric materials. The first conductor plate layer 104, the second conductor plate layer 108, the third conductor plate layer 112, and the fourth conductor plate layer 116 may include tantalum, titanium, copper, nickel, cobalt, tungsten, titanium nitride, or tantalum nitride. In one embodiment, they may include titanium nitride or tantalum nitride. The first insulator layer 106, the second insulator layer 110 and the third insulator layer 114 may include a high-k dielectric material, such as hafnium oxide, hafnium aluminum oxide, hafnium zirconium oxide, zirconium oxide, zirconium aluminum oxide, aluminum oxide, silicon nitride, or a combination thereof. In one embodiment, they include hafnium oxide.

As shown in FIG. 3, in the even-number-layer-enclosure configuration, the second ($2^{nd}$) conductor plate layer 108 encloses the underlying first ($1^{st}$) conductor plate layer 104 and the fourth ($4^{th}$) conductor plate layer 116 encloses the underlying third ($3^{rd}$) conductor plate layer 112. As used herein, enclosure or enclosing refers to a condition where a vertical projection area of one layer is greater than a vertical projection area of another layer such that the former completely covers the latter over either a front surface or a back surface. That is, the vertical projection area of the second ($2^{nd}$) conductor plate layer 108 on the X-Y plane is greater than the vertical projection area of the first ($1^{st}$) conductor plate layer 104 on the X-Y and the vertical projection area of the fourth ($4^{th}$) conductor plate layer 116 on the X-Y plane is greater than the vertical projection area of the third ($3^{rd}$) conductor plate layer 112 on the X-Y plane. For case of illustration, widths along the X direction are used as proxies for vertical projection areas. In embodiments represented in FIG. 3, a second width W2 of the second conductor plate layer 108 is greater than a first width W1 of the first conductor plate layer 104, a fourth width W4 of the fourth conductor plate layer 116 is greater than a third width W3 of the third conductor plate layer 112, and the second width W2 of the second conductor plate layer 108 is greater than the third width W3 of the third conductor plate layer 112.

The even-number-layer enclosure configuration illustrated in FIG. 3 include a mixture of wider-top-narrower-bottom (TB) and wider-bottom-narrower-top (BT) and BT arrangements. The larger second conductor plate layer 108 and the smaller first conductor plate layer 104 represent a TB arrangement. The smaller third conductor plate layer 112 and the larger second conductor plate layer 108 represent a BT arrangement. The larger fourth conductor plate layer 116 and the smaller third conductor plate layer 112 represent a TB arrangement. This mixture allows that the even-number-layer-enclosure configuration to have the best of both arrangements.

Because the even-number-layer-enclosure does not specify how the even-numbered conductor plate layers compare with one another and how the odd-numbered conductor plate layers compare with one another, the even-number-layer-enclosure configuration shown FIG. 3 may include 9 sub-configurations that are better illustrated in top views shown in FIGS. 4-12. For case of illustration, each of the conductor plate layers in FIGS. 4-12 is illustrated with a different style of lines shown in FIG. 3. In the example shown in FIG. 4, the second width W2 is greater than the fourth width W4, the fourth width W4 is greater than the first width W1, and the first width W1 is greater than the third width W3. In the example shown in FIG. 5, the fourth width W4 is greater than the second width W2, the second width W2 is greater than the first width W1, and the first width W1 is greater than the third width W3. In the example shown in FIG. 6, the second width W2 is greater than the fourth width W4, the fourth width W4 is greater than the third width W3, and the third width W3 is greater than the first width W1. In the example shown in FIG. 7, the fourth width W4 is greater than the second width W2, the second width W2 is greater than the third width W3, and the third width W3 is greater than the first width W1. In the example shown in FIG. 8, the second width W2 is substantially identical to the fourth width W4, the fourth width W4 is greater than the first width W1, and the first width W1 is greater than the third width W3. In the example shown in FIG. 9, the second width W2 is substantially identical to the fourth width W4, the fourth width W4 is greater than the third width W3, and the third width W3 is greater than the first width W1. In the example shown in FIG. 10, the second width W2 is greater than the fourth width W4, the fourth width W4 is greater than the third width W3, and the third width W3 is substantially identical to the first width W1. In the example shown in FIG. 11, the fourth width W4 is greater than the second width W2, the second width W2 is greater than the third width W3, and the third width W3 is substantially identical to the first width W1. In the example shown in FIG. 12, the second width W2 is substantially identical to the fourth width W4, the fourth width W4 is greater than the third width W3, and the third width W3 is substantially identical to the first width W1. In all of the examples shown in FIGS. 4-12, the second width W2 is greater than the first width W1, the fourth width W4 is greater than the third width W3, the second width W2 is greater than the third width W3.

Figure 13:
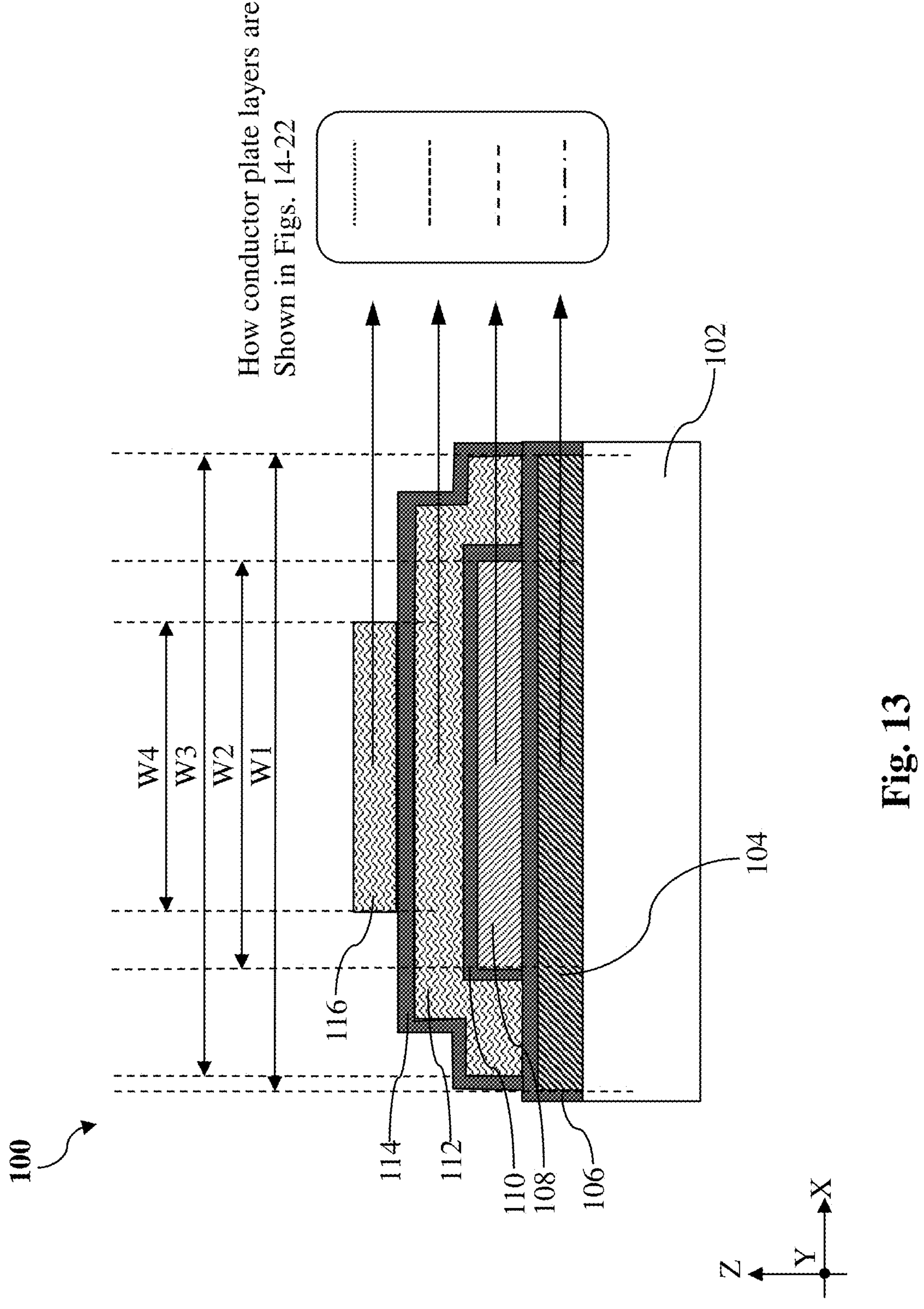
Figures 14, 15, 16, 17, 18, 19, 20, 21, 22:
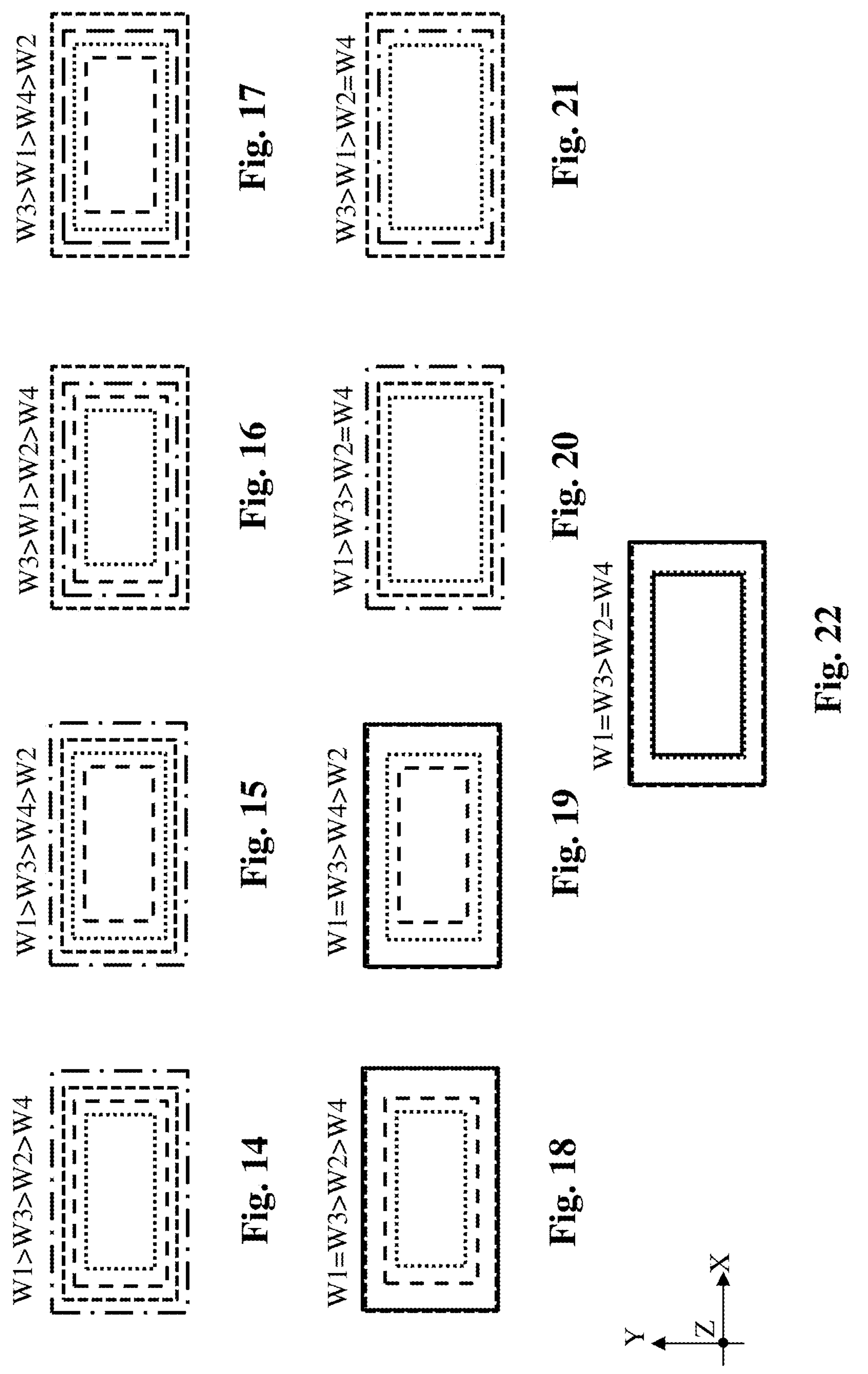

FIG. 13 illustrates a device structure 100 that follows the odd-number-layer-enclosure configuration. The device structure 100 in FIG. 13 includes a passivation layer 102, a first conductor plate layer 104 disposed on the passivation layer 102, a first insulator layer 106 disposed on the first conductor plate layer 104, a second conductor plate layer 108 disposed on the first insulator layer 106, a second insulator layer 110 disposed on the second conductor plate layer 108, a third conductor plate layer 112 disposed on the second insulator layer 110, a third insulator layer 114 disposed on the third conductor plate layer 112, and a fourth conductor plate layer 116 disposed on the third insulator layer. In some embodiments, the passivation layer 102 may include silicon oxide, undoped silica glass (USG), or other suitable dielectric materials. The first conductor plate layer 104, the second conductor plate layer 108, the third conductor plate layer 122, and the fourth conductor plate layer 116 may include titanium nitride or tantalum nitride. The first insulator layer 106, the second insulator layer 110 and the third insulator layer 114 may include a high-k dielectric material, such as hafnium oxide, hafnium aluminum oxide, hafnium zirconium oxide, zirconium oxide, zirconium aluminum oxide, aluminum oxide, silicon nitride, or a combination thereof.

As shown in FIG. 13, in the odd-number-layer-enclosure configuration, the first ($1^{st}$) conductor plate layer 104 encloses the overlying second ($2^{nd}$) conductor plate layer 108 and the third ($3^{rd}$) conductor plate layer 112 encloses the overlying fourth ($4^{th}$) conductor plate layer 116. As used herein, enclosure or enclosing refers to a condition where a vertical projection area of one layer is greater than a vertical projection area of another layer such that the former completely covers the latter over either a front surface or a back surface. That is, the vertical projection area of the first ($1^{st}$) conductor plate layer 104 on the X-Y plane is greater than the vertical projection area of the second ($2^{nd}$) conductor plate layer 108 on the X-Y and the vertical projection area of the third ($3^{rd}$) conductor plate layer 112 on the X-Y plane is greater than the vertical projection area of the fourth ($4^{th}$) conductor plate layer 116 on the X-Y plane. For ease of illustration, widths along the X direction are used as proxies for vertical projection areas. In embodiments represented in FIG. 13, a first width W1 of the first conductor plate layer 104 is greater than a second width W2 of the second conductor plate layer 108, a third width W3 of the third conductor plate layer 112 is greater than a fourth width W4 of the fourth conductor plate layer 116, and the third width W3 of the third conductor plate layer 112 is greater than the second width W2 of the second conductor plate layer 108.

The odd-number-layer enclosure configuration illustrated in FIG. 13 include a mixture of wider-top-narrower-bottom (TB) and wider-bottom-narrower-top (BT) and BT arrangements. The larger first conductor plate layer 104 and the smaller second conductor plate layer 108 represent a BT arrangement. The smaller second conductor plate layer 108 and the larger third conductor plate layer 112 represent a TB arrangement. The larger third conductor plate layer 112 and the smaller fourth conductor plate layer 116 represent a BT arrangement. This mixture allows that the odd-number-layer-enclosure configuration to have the best of both arrangements.

Because the odd-number-layer-enclosure does not specify how the even-numbered conductor plate layers compare with one another and how the odd-numbered conductor plate layers compare with one another, the odd-number-layer-enclosure configuration shown FIG. 13 may include 9 sub-configurations that are better illustrated in top views shown in FIGS. 14-22. For case of illustration, each of the conductor plate layers in FIGS. 14-22 is illustrated with a different style of lines shown in FIG. 13. In the example shown in FIG. 14, the first width W1 is greater than the third width W3, the third width W3 is greater than the second width W2, and the second width W2 is greater than the fourth width W4. In the example shown in FIG. 15, the first width W1 is greater than the third width W3, the third width W3 is greater than the fourth width W4, and the fourth width W4 is greater than the second width W2. In the example shown in FIG. 16, the third width W3 is greater than the first width W1, the first width W1 is greater than the second width W2, and the second width W2 is greater than the fourth width W4. In the example shown in FIG. 17, the third width W3 is greater than the first width W1, the first width W1 is greater than the fourth width W4, and the fourth width W4 is greater than the second width W2. In the example shown in FIG. 18, the first width W1 is substantially identical to the third width W3, the third width W3 is greater than the second width W2, and the second width W2 is greater than the fourth width W4. In the example shown in FIG. 19, the first width W1 is substantially identical to the third width W3, the third width W3 is greater than the fourth width W4, and the fourth width W4 is greater than the second width W2. In the example shown in FIG. 20, the first width W1 is greater than the third width W3, the third width W3 is greater than the second width W2, and the second width W2 is substantially identical to the fourth width W4. In the example shown in FIG. 21, the third width W3 is greater than the first width W1, the first width W1 is greater than the second width W2, and the second width W2 is substantially identical to the fourth width W4. In the example shown in FIG. 22, the first width W1 is substantially identical to the third width W3, the third width W3 is greater than the second width W2, and the second width W2 is substantially identical to the fourth width W4. In all of the examples shown in FIGS. 14-22, the first width W1 is greater than the second width W2, the third width W3 is greater than the fourth width W4, and the third width W3 is greater than the second width W2.

Figure 23:
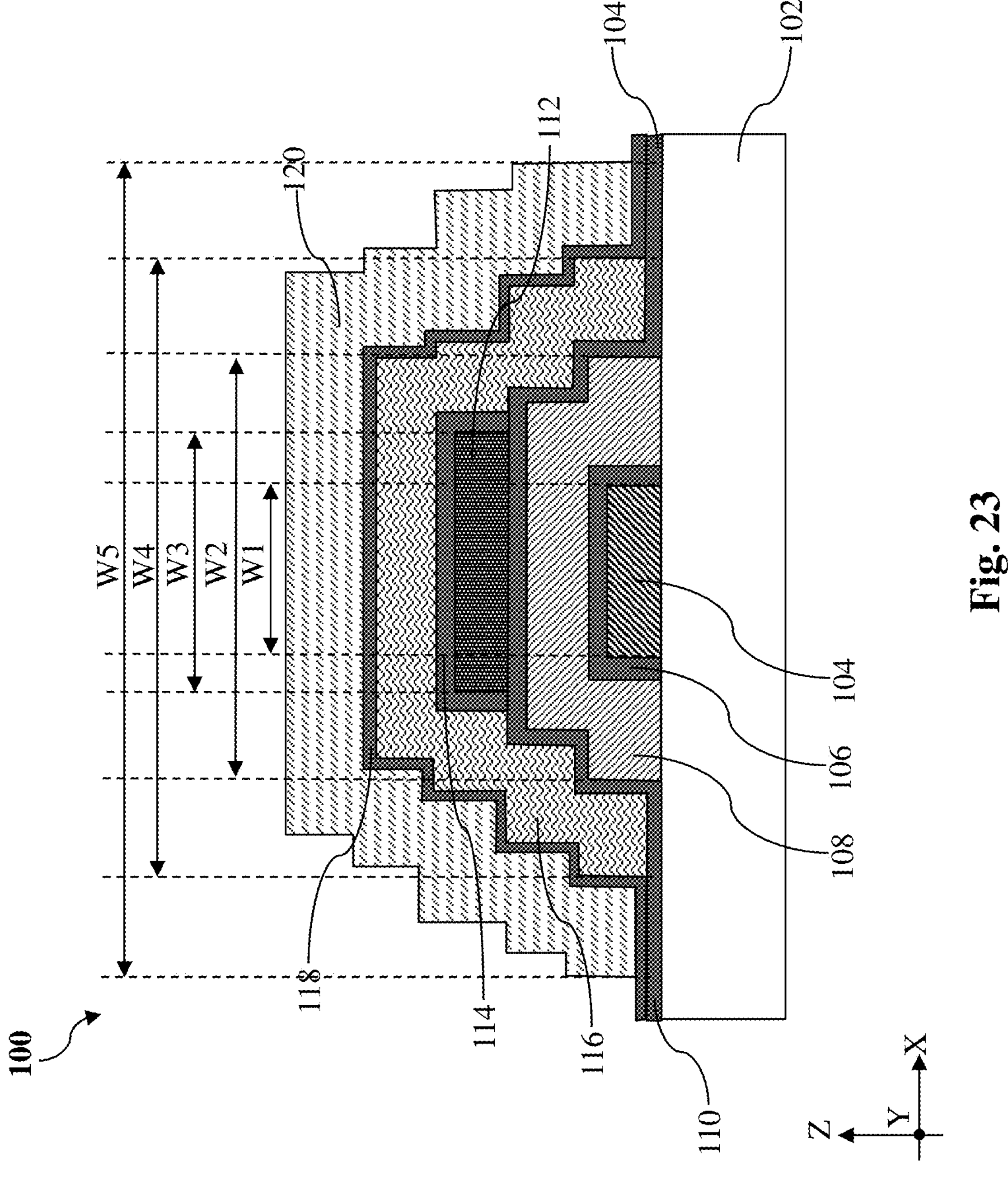
Figure 24:
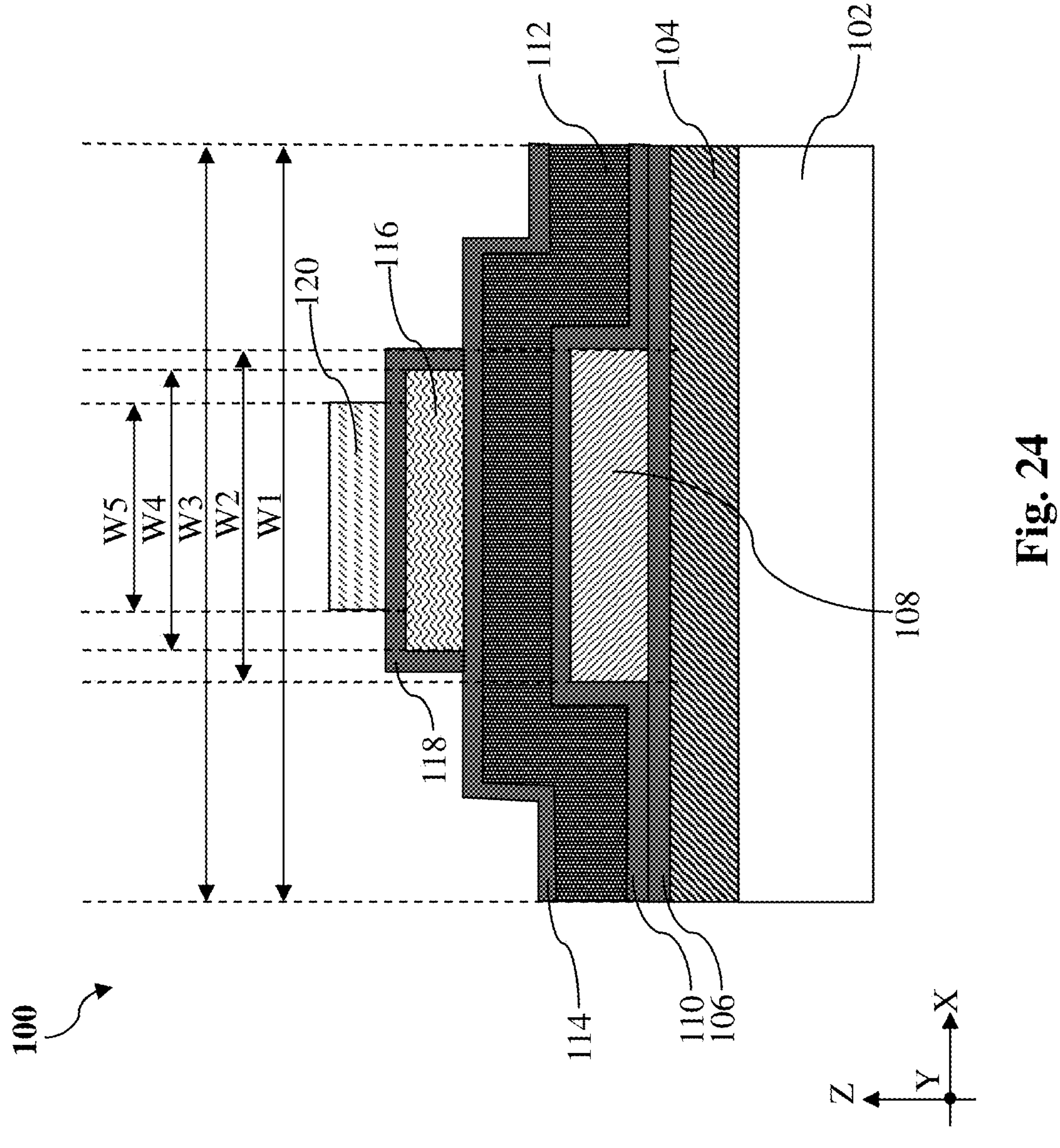

In some alternative embodiments shown in FIGS. 23 and 24, the even-number-layer-enclosure configuration may be hybridized with odd-number-layer-enclosure. A hybrid of the odd-number-layer-enclosure and even-number-layer-enclosure can be better understood using an MIM structure with five conductor plate layers. Reference is first made to FIG. 23. The device structure 100 shown in FIG. 23 is similar to the device structure 100 of the even-number-layer-enclosure configuration shown in FIG. 3 but further includes a fourth insulator layer 118 disposed on the fourth conductor plate layer 116 and a fifth conductor plate layer 120 disposed on the fourth insulator layer 118. Instead of following the even-number-layer-enclosure configuration embodied by the first fourth conductor plate layers, a fifth width W5 of the odd-numbered fifth ($5^{th}$) conductor plate layer 120 is larger than the fourth width W4 of the even-numbered fourth ($4^{th}$) conductor plate layer 116. This makes the fifth conductor plate layer 120 the largest conductor plate layer in the device structure 100 in FIG. 23. In the embodiments represented in FIG. 23, the fifth conductor plate layer 120 is an exception to or an outlier of the even-number-layer-enclosure configuration seen in the rest of the device structure 100. With the exception of the fifth conductor plate layer 120, which is the largest conductor plate layer, the first fourth conductor plate layers may have structures shown in FIGS. 4-12.

Reference is then made to FIG. 24. The device structure 100 shown in FIG. 24 is similar to the device structure 100 of the odd-number-layer-enclosure configuration shown in FIG. 13 but further includes a fourth insulator layer 118 disposed on the fourth conductor plate layer 116 and a fifth conductor plate layer 120 disposed on the fourth insulator layer 118. Instead of following the odd-number-layer-enclosure configuration embodied by the first fourth conductor plate layers, a fifth width W5 of the odd-numbered fifth ($5^{th}$) conductor plate layer 120 is smaller than the fourth width W4 of the even-numbered fourth ($4^{th}$) conductor plate layer 116. This makes the fifth conductor plate layer 120 the smallest conductor plate layer in the device structure 100 in FIG. 24. In the embodiments represented in FIG. 24, the fifth conductor plate layer 120 is an exception to or an outlier of the odd-number-layer-enclosure configuration seen in the rest of the device structure 100. With the exception of the fifth conductor plate layer 120, which is the smallest conductor plate layer, the first fourth conductor plate layers may have structures shown in FIGS. 14-22.

Figures 25, 26, 27, 28, 29, 30, 31, 32, 33, 34, 35, 36:
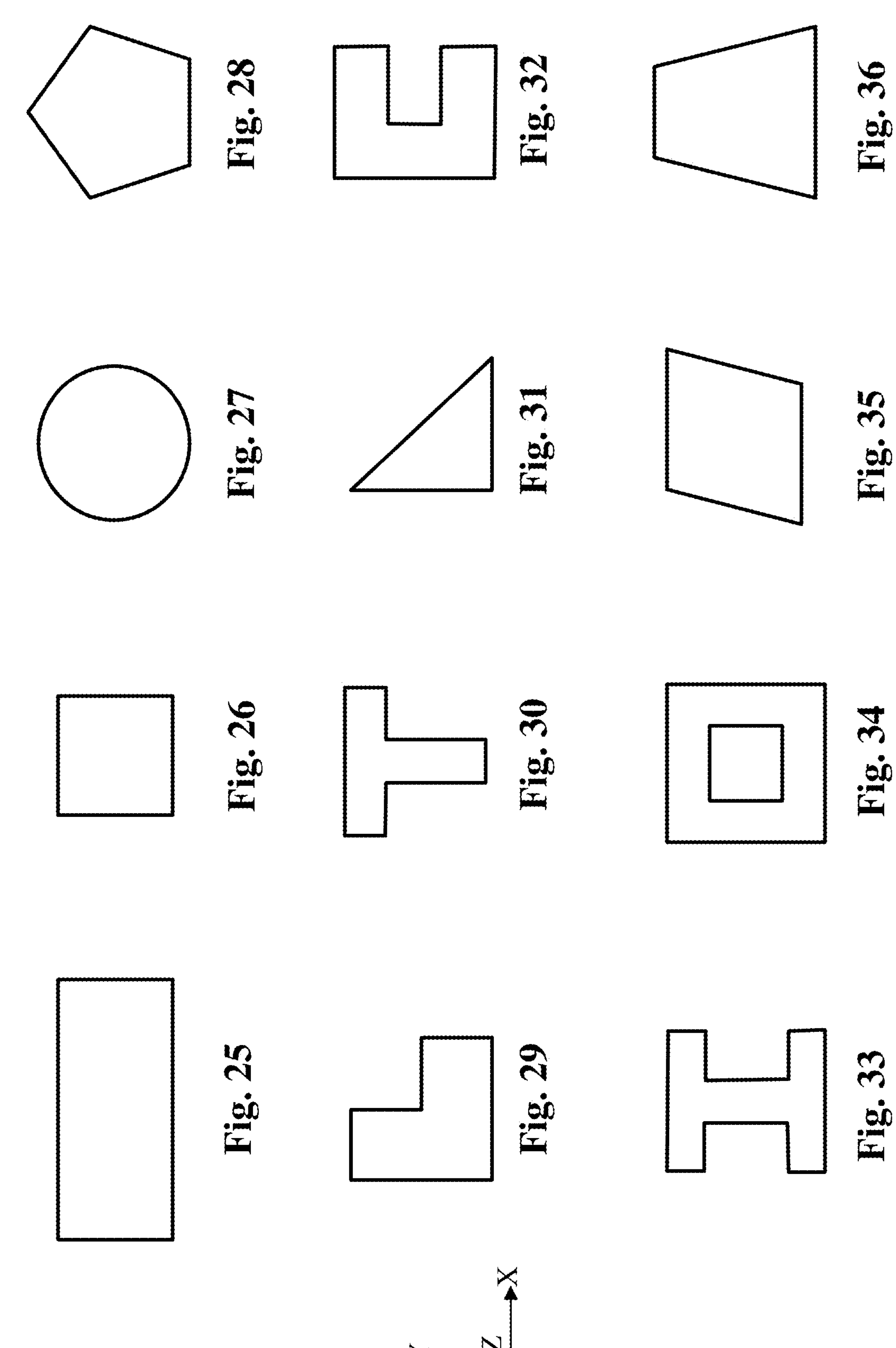

While the conductor plate layers shown in FIGS. 4-12 and 14-22 are substantially rectangular in shape, the present disclosure is not so limited. Conductor plate layers of other top-view shapes are fully envisioned. Example top-view shapes of the conductor plate layers are illustrated in FIGS. 25-36. For example, each of the conductor plate layers may be rectangular in shape as shown in FIG. 25, square in shape as shown in FIG. 26, circular in shape as shown in FIG. 27, pentagon in shape as shown in FIG. 28, L-shape as shown in FIG. 29, T-shape as shown in FIG. 30, triangular as shown in FIG. 31, C-shape as shown in FIG. 32, I-shape as shown in FIG. 33, O-shape as shown in FIG. 34, parallelogram in shape as shown in FIG. 35, or trapezoidal in shape as shown in FIG. 36.

Figure 37:
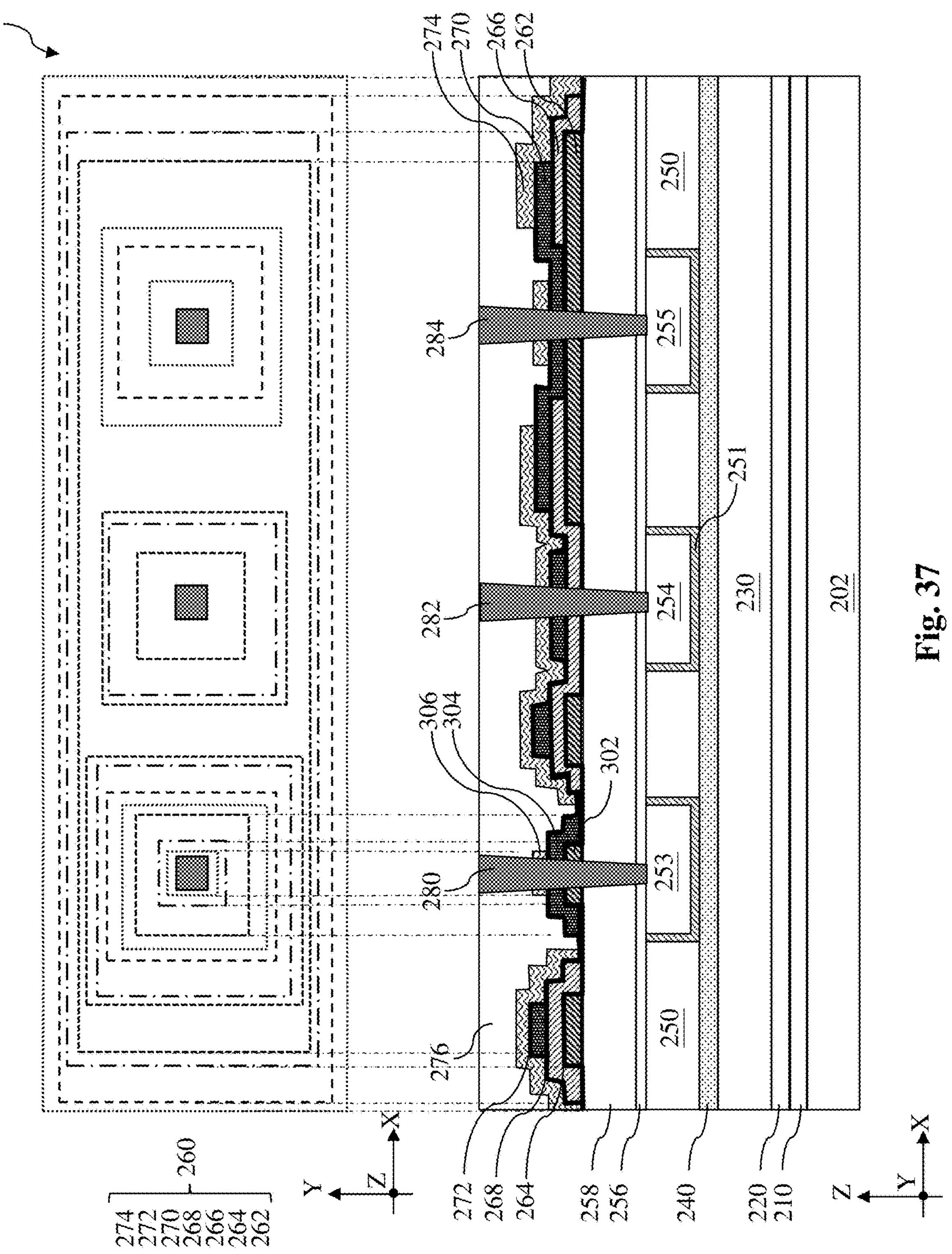
Figure 38:
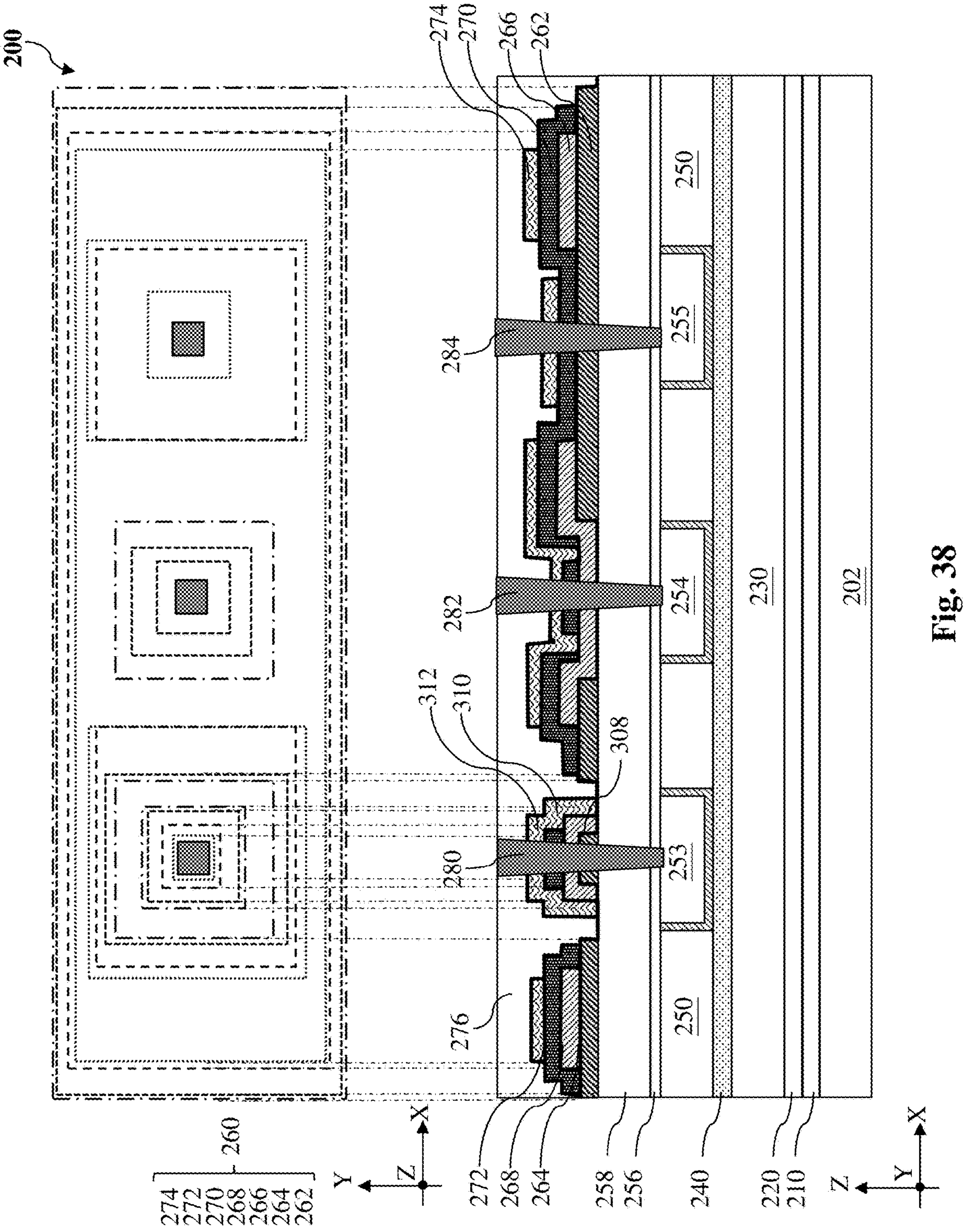

When implemented at the BEOL level, more than one contact via may be formed through the conductor plate layers of an MIM structure. FIG. 37 illustrates an even-number-layer-enclosure MIM structure that is electrically coupled to top metal features. FIG. 38 illustrates an odd-number-layer-enclosure MIM structure that is electrically coupled to top metal features. Reference is first made to FIG. 37, where a fragmentary cross-sectional view and a corresponding top view of a device structure 200 are shown. The device structure 200 in FIG. 37 includes a substrate 202, which may be made of silicon or other semiconductor materials, such as germanium (Ge) or silicon germanium (SiGe). In some embodiments, the substrate 202 may include a compound semiconductor, such as silicon carbide (SiC), silicon phosphide (SiP), gallium arsenide (GaAs), gallium phosphide (GaP), indium phosphide (InP), indium arsenide (InAs), indium antimonide (InSb), zinc oxide (ZnO), zinc selenide (ZnSe), zinc sulfide (ZnS), zinc telluride (ZnTe), cadmium selenide (CdSe), cadmium sulfide (CdS), and/or cadmium telluride (CdTe); an alloy semiconductor, such as silicon germanium (SiGe), silicon phosphorus carbide (SiPC), gallium arsenic phosphide (GaAsP), aluminum indium arsenide (AlInAs), aluminum gallium arsenide (AlGaAs), gallium indium arsenide (GaInAs), gallium indium phosphide (GaInP), and/or gallium indium arsenic phosphide (GaInAsP); other group III-V materials; other group II-VI materials; or combinations thereof. Alternatively, substrate 202 is a semiconductor-on-insulator substrate, such as a silicon-on-insulator (SOI) substrate or a germanium-on-insulator (GeOI) substrate. In some embodiments, the substrate 202 may include an epitaxial layer, for example an epitaxial layer overlying a bulk semiconductor. Various microelectronic components may be formed in or on the substrate 202, such as transistor components including source/drain features, gate structures, gate spacers, source/drain contacts, gate contacts, isolation structures including shallow trench isolation (STI), or any other suitable components. Transistor components formed on the substrate 202 may include multi-gate devices, such as fin-type field effect transistors (FinFETs), nanowire transistors, nanosheet transistors, nanorod transistors, multi-bridge-channel (MBC) transistors, or other FETs with nanostructures. A FinFET has an elevated channel wrapped by a gate on more than one side (for example, the gate wraps a top and sidewalls of a "fin" of semiconductor material extending from a substrate). An MBC transistor has a gate structure that can extend, partially or fully, around a channel region to provide access to the channel region on two or more sides. Because its gate structure surrounds the channel regions, an MBC transistor may also be referred to as a surrounding gate transistor (SGT) or a gate-all-around (GAA) transistor.

The device structure 200 also includes an interconnect layer 210. The interconnect layer 210 may be one of the interconnect layers in a multi-layered interconnect (MLI) structure, which is formed over the substrate 202 and may include multiple patterned dielectric layers and conductive layers that provide interconnections (e.g., wiring) between the various microelectronic components of the device structure 200. There may be intermediate layers or components between the interconnect layer 210 and the substrate 202, but in the interest of simplicity such layers or components are not shown. The multiple patterned dielectric layers may be referred to as intermetal dielectric (IMD) layers and may include silicon oxide or a low-k dielectric material whose k-value (dielectric constant) is smaller than that of silicon oxide, which is about 3.9. In some embodiments, the low-k dielectric material includes a porous organosilicate thin film such as SiOCH, tetraethylorthosilicate (TEOS) oxide, undoped silicate glass, doped silicon oxide such as borophosphosilicate glass (BPSG), fused silica glass (FSG), phosphosilicate glass (PSG), fluorine-doped silicon dioxide, carbon-doped silicon dioxide, porous silicon dioxide, porous carbon-doped silicon dioxide, silicon carbon nitride (SiCN), silicon oxycarbide (SiOCN), spin-on silicon based polymeric dielectrics, or combinations thereof. The conductive layers in the interconnect layer 210 may include contacts, vias, or metal lines.

The device structure 200 includes a carbide layer 220 disposed on the interconnect layer 210. The carbide layer 220 may include silicon carbide (SiC) or other carbide-containing dielectric materials. The device structure 200 also includes an oxide layer 230 is on the carbide layer 220. The oxide layer 230 may include an oxide-containing dielectric material, such as silicon oxide, or silicon oxynitride. In some alternative embodiments not explicitly shown in the figures, the interconnect layer 210, the carbide layer 220 and the oxide layer 230 may be replaced with one or more interconnect structures. An etch stop layer (ESL) 240 is disposed on the oxide layer 230. The ESL 240 may include silicon carbonitride (SiCN), silicon oxycarbide (SiOC), silicon carbide (SiC), silicon oxycarbonitride (SiOCN), or silicon nitride (SiN), or combinations thereof. The device structure 200 further includes a first dielectric layer 250 disposed on the ESL 240. In some embodiments, the first dielectric layer 250 includes undoped silica glass (USG) or silicon oxide.

Referring still to FIG. 37, the device structure 200 includes one or more top metal (TM) features (such as 253, 254, and 255) in the first dielectric layer 250. Each of the top metal features 253, 254, and 255 may include a barrier layer 251 and a metal fill layer. In some embodiments, the barrier layer 251 includes titanium nitride (TiN), tantalum (Ta), titanium (Ti), tantalum nitride (TaN), a suitable metal, a suitable metal nitride, or combinations thereof. In some embodiments, the metal fill layer includes a metal or metal alloy such as copper (Cu), cobalt (Co), nickel (Ni), aluminum (Al), tungsten (W), ruthenium (Ru), titanium (Ti), or combinations thereof. In the depicted embodiment, the top metal features 253, 254, and 255 are formed of copper (Cu).

The device structure 200 further includes a second dielectric layer 256 and a third dielectric layer 258 are deposited over the top metal features 253, 254, and 255. The second dielectric layer 256 may include silicon carbonitride (SiCN), silicon nitride (SiN), and/or or other suitable materials that may protect the top metal features 253, 254, and 255 from being oxidized. The second dielectric layer 256 may be deposited using chemical vapor deposition (CVD). The third dielectric layer 258 is deposited over the second dielectric layer 256. The third dielectric layer 258 may include an oxide material, such as undoped silica glass (USG), or other suitable material(s). The third dielectric layer 258 may be deposited using CVD, flowable CVD (FCVD), or spin-on coating.

As shown in FIG. 37, the device structure 200 includes a metal-insulator-metal (MIM) structure 260 over the third dielectric layer 258. The MIM structure 260 includes multiple conductor plate layers interleaved by multiple insulator layers. In some embodiments represented in FIG. 37, the MIM structure 260 includes a first conductor plate layer 262, a second conductor plate layer 266, a third conductor plate layer 270, and a fourth conductor plate layer that are interleaved by a first insulator layer 264, a second insulator layer 268, and a third insulator layer 272. The first conductor plate layer 262, the second conductor plate layer 266, the third conductor plate layer 270, and the fourth conductor plate layer 274 may include titanium nitride or tantalum nitride. The first insulator layer 264, the second insulator layer 268 and the third insulator layer 272 may include a high-k dielectric material, such as hafnium oxide, hafnium aluminum oxide, hafnium zirconium oxide, zirconium oxide, zirconium aluminum oxide, aluminum oxide, silicon nitride, or a combination thereof. In one embodiment, they include hafnium oxide. In FIG. 37, the device structure 200 further includes a fourth dielectric layer 276 deposited over the MIM structure 260. In some embodiments, like the third dielectric layer 258, the fourth dielectric layer 276 may include an oxide material, such as undoped silica glass (USG), or other suitable material(s). As shown in FIG. 37, the MIM structure 260 is sandwiched between the third dielectric layer 258 and the fourth dielectric layer 276, which may have the same material.

A first contact via 280, a second contact via 282, and a third contact via 284 extend through the fourth dielectric layer 276, the MIM structure 260, and the third dielectric layer 258 to couple to the top metal features 253, 254 and 255 respectively. As shown in FIG. 37, each of the first contact via 280, the second contact via 282, and the third contact via 284 may be in electrical communication with different numbers of conductor plate layers. The third contact via 284 is electrically coupled to the first conductor plate layer 262 and the third conductor plate layer 270. The second contact via 282 is electrically coupled to the second conductor plate layer 266 and the fourth conductor plate layer 274. The first contact via 280 is electrically insulated from all of the conductor plate layers.

Because the contact via openings for the first contact via 280, the second contact via 282 and the third contact via 284 are formed at the same time using the same processes, dummy pads are inserted to make sure that the contact via openings are formed through the same number of metal layers. For example, the first contact via 280 extends through a first dummy pad 302, a second dummy pad 304, and a third dummy pad 306 along the Z direction, even though the first contact via 280 is electrically isolated from all of the conductor plate layers by design. Each of the first dummy pad 302, the second dummy pad 304 and the third dummy pad 306 are insulated from the conductor plate layers by the first insulator layer 264, the second insulator layer 268, the third insulator layer 272, and/or the fourth dielectric layer 276. In the depicted embodiment, the first dummy pad 302 is formed along with the first conductor plate layer 262, the second dummy pad 304 is formed along with the third conductor plate layer 270, and the third dummy pad 306 is formed along with the fourth conductor plate layer 274. Similarly, each of the second contact via 282 and the third contact via 284 also extends through one dummy pad even though it is only electrically coupled to two of the conductor plate layers.

Reference is still made to FIG. 37. Outer edges of the first conductor plate layer 262, the second conductor plate layer 266, the third conductor plate layer 270, and the fourth conductor plate layer 274 are in even-number-layer-enclosure configuration. The second ($2^{nd}$) conductor plate layer 266 is larger than and encloses the underlying first ($1^{st}$) conductor plate layer 262. The fourth ($4^{th}$) conductor plate layer 274 is larger than and encloses the underlying third ($3^{rd}$) conductor plate layer 270. Because each of the conductor plate layer has to be spaced apart from a dummy pad that is contemporarily formed, dimensions of a dummy pad may be inversely correlated with dimensions of the conductor plate layer. For example, while the fourth conductor plate layer 274 is the largest layer in terms of its outer edges, the third dummy pad 306 is the smallest out of all the dummy pads that are passed through by the first contact via 280. While the third conductor plate layer 270 is the smallest in terms of its outer edges, the second dummy pad 304 is the largest out of all the dummy pads that are passed through by the first contact via 280.

Reference is now made to FIG. 38, where a fragmentary cross-sectional view and a corresponding top view of a device structure 200 are shown. Like the device structure 200 in FIG. 37, the device structure 200 in FIG. 38 includes a substrate 202, an interconnect layer 210, a carbide layer 220 disposed on the interconnect layer 210, an oxide layer 230 disposed on the carbide layer 220, an etch stop layer (ESL) 240 disposed on the oxide layer 230, a first dielectric layer 250 disposed on the ESL 240, one or more top metal (TM) features (such as 253, 254, and 255) in the first dielectric layer 250, a second dielectric layer 256, a third dielectric layer 258, an MIM structure 260 over the third dielectric layer 258, and a fourth dielectric layer 276 over the MIM structure 260. Throughout the present disclosure, like reference numerals denote like features with similar compositions. As various features in the device structure 200 in FIG. 38 have been similarly described above with respect to the device structure shown in FIG. 37, detailed descriptions thereof are omitted for brevity.

The MIM structure 260 in FIG. 38 also includes a first conductor plate layer 262, a second conductor plate layer 266, a third conductor plate layer 270, and a fourth conductor plate layer that are interleaved by a first insulator layer 264, a second insulator layer 268, and a third insulator layer 272. A first contact via 280, a second contact via 282, and a third contact via 284 extend through the fourth dielectric layer 276, the MIM structure 260, and the third dielectric layer 258 to couple to the top metal features 253, 254 and 255 respectively. As shown in FIG. 38, each of the first contact via 280, the second contact via 282, and the third contact via 284 may be in electrical communication with different numbers of conductor plate layers. The third contact via 284 is electrically coupled to the first conductor plate layer 262 and the third conductor plate layer 270. The second contact via 282 is electrically coupled to the second conductor plate layer 266 and the fourth conductor plate 274. The first contact via 280 is electrically insulated from all of the conductor plate layers.

Because the contact via openings for the first contact via 280, the second contact via 282 and the third contact via 284 are formed at the same time using the same processes, dummy pads are inserted to make sure that the contact via openings are formed through the same number of metal layers. For example, the first contact via 280 extends through a fourth dummy pad 308, a fifth dummy pad 310, and a sixth dummy pad 312, even though the first contact via 280 is electrically isolated from all of the conductor plate layers by design. Each of the fourth dummy pad 308, the fifth dummy pad 310 and the sixth dummy pad 312 are insulated from the conductor plate layers by the first insulator layer 264, the second insulator layer 268, the third insulator layer 272, and/or the fourth dielectric layer 276. In the depicted embodiment, the fourth dummy pad 308 is formed along with the first conductor plate layer 262, the fifth dummy pad 310 is formed along with the third conductor plate layer 270, and the sixth dummy pad 312 is formed along with the fourth conductor plate layer 274. Similarly, each of the second contact via 282 and the third contact via 284 also extends through one dummy pad even though it is only electrically coupled to two of the conductor plate layers.

Reference is still made to FIG. 38. Outer edges of the first conductor plate layer 262, the second conductor plate layer 266, the third conductor plate layer 270, and the fourth conductor plate layer 274 are in odd-number-layer-enclosure configuration. The first ($1^{st}$) conductor plate layer 262 is larger than and encloses the overlying second ($2^{nd}$) conductor plate layer 266. The third ($3^{rd}$) conductor plate layer 270 is larger than and encloses the overlying fourth ($4^{th}$) conductor plate layer 274. Because each of the conductor plate layer has to be spaced apart from a dummy pad that is contemporarily formed, dimensions of a dummy pad may be inversely correlated with dimensions of the conductor plate layer. For example, while the first conductor plate layer 262 is the largest layer in terms of its outer edges, the fourth dummy pad 308 is the smallest out of all the dummy pads that are passed through by the first contact via 280. While the fourth conductor plate layer 274 is the smallest in terms of its outer edges, the sixth dummy pad 312 is the largest out of all the dummy pads that are passed through by the first contact via 280.

Figures 39, 40:
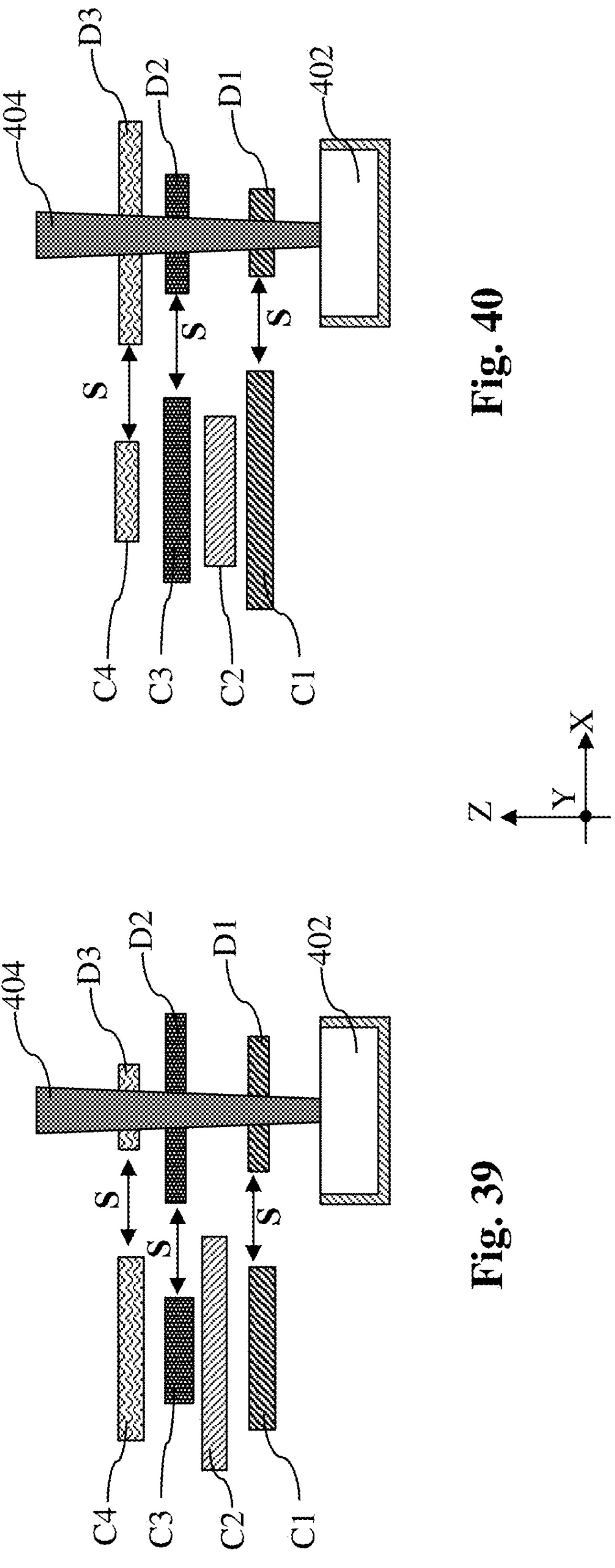

FIGS. 39-44 illustrate the reciprocal relationship between a conductor plate and a dummy pad formed along with the conductor plate in embodiments with 4 to 6 conductor plate layers. FIG. 39 illustrates a 4-layer MIM structure in an even-number-layer-enclosure configuration. Using the X-direction widths as proxies of the overall area along the X-Y plane, the second conductor plate layer C2 is larger than and encloses the underlying first conductor plate layer C1 and the fourth conductor plate layer C4 is larger than and encloses the underlying third conductor plate layer C3. To ensure that dummy pads are electrically insulated from the conductor plate layers, each of the dummy pads is spaced apart from the contemporarily formed conductor plate layer by a spacing S. The first dummy pad D1 is spaced apart from the first conductor plate layer C1 by the spacing S. The second dummy pad D2 is spaced apart from the third conductor plate layer C3 by the spacing S. The third dummy pad D3 is spaced apart from the fourth conductor plate layer C4 by the spacing S. As the spacing S is substantially uniform across the MIM structure, dimensions of the dummy pads and dimensions of the conductor plate layers have a reciprocal relationship. For example, in FIG. 39, the third dummy pad D3 is smaller than the second dummy pad D2 as the fourth conductor plate layer C4 is larger than the third conductor plate layer C3. A contact via 404 that extends through the dummy pads but is isolated from the conductor plate layers may be referred to as a logic contact via that carries logic signals from a top metal contact feature 402.

FIG. 40 illustrates a 4-layer MIM structure in an odd-number-layer-enclosure configuration. Using the X-direction widths as proxies of the overall area along the X-Y plane, the first conductor plate layer C1 is larger than and encloses the overlying second conductor plate layer C2 and the third conductor plate layer C3 is larger than and encloses the overlying fourth conductor plate layer C4. To ensure that dummy pads are electrically insulated from the conductor plate layers, each of the dummy pads is spaced apart from the contemporarily formed conductor plate layer by a spacing S. The first dummy pad D1 is spaced apart from the first conductor plate layer C1 by the spacing S. The second dummy pad D2 is spaced apart from the third conductor plate layer C3 by the spacing S. The third dummy pad D3 is spaced apart from the fourth conductor plate layer C4 by the spacing S. As the spacing S is substantially uniform across the MIM structure, dimensions of the dummy pads and dimensions of the conductor plate layers have a reciprocal relationship. For example, in FIG. 40, the third dummy pad D3 is larger than the second dummy pad D2 as the fourth conductor plate layer C4 is smaller than the third conductor plate layer C3. A contact via 404 that extends through the dummy pads but is isolated from the conductor plate layers may be referred to as a logic contact via that carries logic signals from a top metal contact feature 402.

Figures 41, 42:
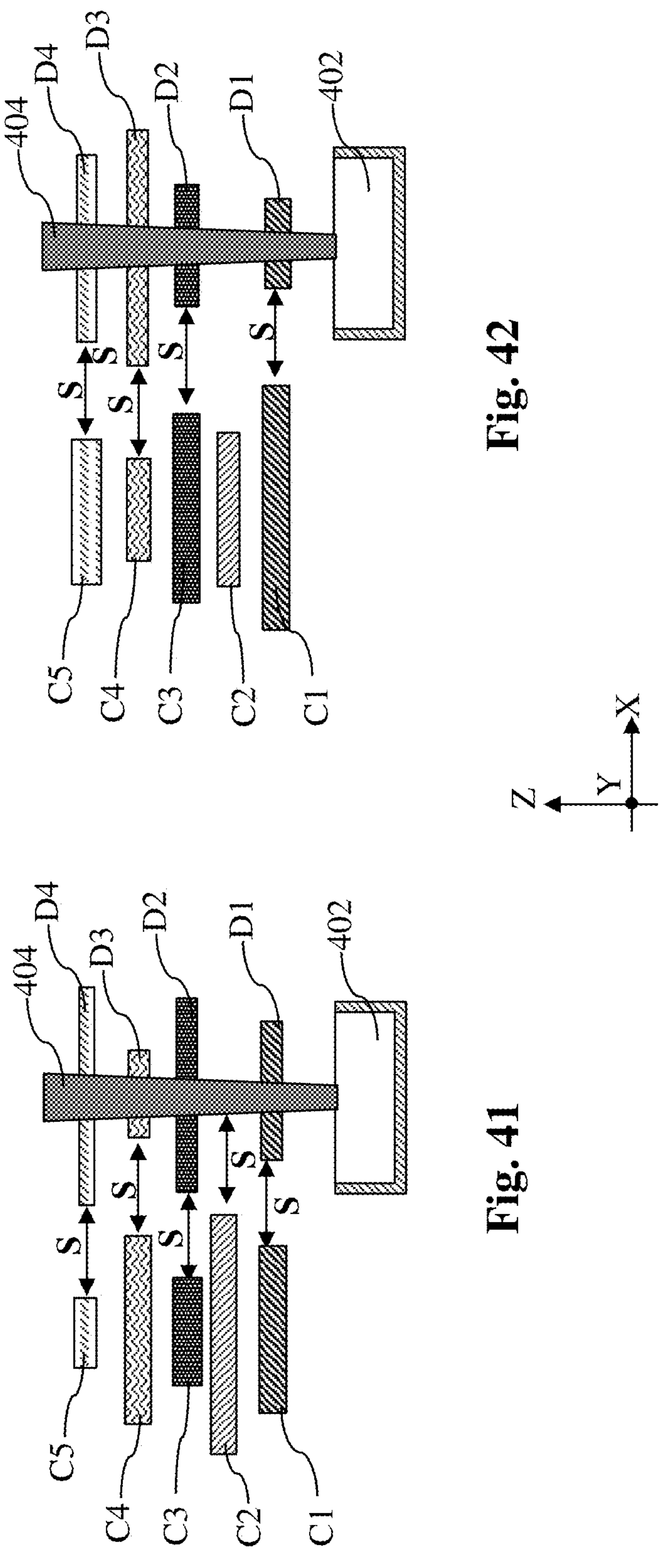

FIG. 41 illustrates a 5-layer MIM structure in an even-number-layer-enclosure configuration. Using the X-direction widths as proxies of the overall area along the X-Y plane, the second conductor plate layer C2 is larger than and encloses the underlying first conductor plate layer C1, the fourth conductor plate layer C4 is larger than and encloses the underlying third conductor plate layer C3, and the fourth conductor plate layer C4 is larger than and encloses the overlying fifth conductor plate layer C5. To ensure that dummy pads are electrically insulated from the conductor plate layers, each of the dummy pads is spaced apart from the contemporarily formed conductor plate layer by a spacing S. The first dummy pad D1 is spaced apart from the first conductor plate layer C1 by the spacing S. The second dummy pad D2 is spaced apart from the third conductor plate layer C3 by the spacing S. The third dummy pad D3 is spaced apart from the fourth conductor plate layer C4 by the spacing S. The fourth dummy pad D4 is spaced apart from the fifth conductor plate layer C5 by the spacing S. As the spacing S is substantially uniform across the MIM structure, dimensions of the dummy pads and dimensions of the conductor plate layers have a reciprocal relationship. For example, in FIG. 41, the fourth dummy pad D4 is larger than the third dummy pad D3 as the fifth conductor plate layer C5 is smaller than the fourth conductor plate layer C4. A contact via 404 that extends through the dummy pads but is isolated from the conductor plate layers may be referred to as a logic contact via that carries logic signals from a top metal contact feature 402.

FIG. 42 illustrates a 5-layer MIM structure in an odd-number-layer-enclosure configuration. Using the X-direction widths as proxies of the overall area along the X-Y plane, the first conductor plate layer C1 is larger than and encloses the overlying second conductor plate layer C2, the third conductor plate layer C3 is larger than and encloses the overlying fourth conductor plate layer C4, and the fifth conductor plate layer C5 is larger than and encloses the underlying fourth conductor plate layer C4. To ensure that dummy pads are electrically insulated from the conductor plate layers, each of the dummy pads is spaced apart from the contemporarily formed conductor plate layer by a spacing S. The first dummy pad D1 is spaced apart from the first conductor plate layer C1 by the spacing S. The second dummy pad D2 is spaced apart from the third conductor plate layer C3 by the spacing S. The third dummy pad D3 is spaced apart from the fourth conductor plate layer C4 by the spacing S. The fourth dummy pad D4 is spaced apart from the fifth conductor plate layer C5 by the spacing S. As the spacing S is substantially uniform across the MIM structure, dimensions of the dummy pads and dimensions of the conductor plate layers have a reciprocal relationship. For example, in FIG. 42, the third dummy pad D3 is larger than the second dummy pad D2 as the fourth conductor plate layer C4 is smaller than the third conductor plate layer C3. A contact via 404 that extends through the dummy pads but is isolated from the conductor plate layers may be referred to as a logic contact via that carries logic signals from a top metal contact feature 402.

Figures 43, 44:
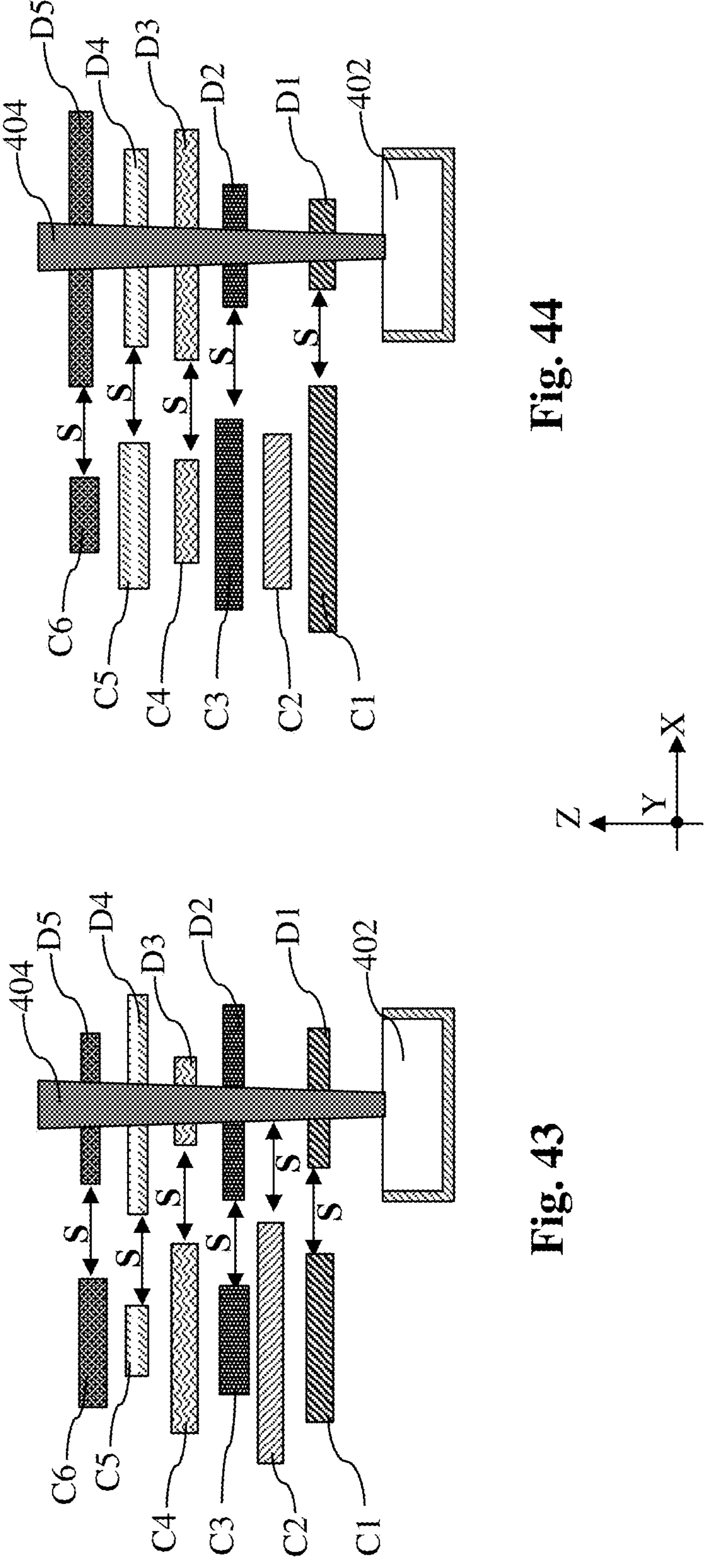

FIG. 43 illustrates a 6-layer MIM structure in an even-number-layer-enclosure configuration. Using the X-direction widths as proxies of the overall area along the X-Y plane, the second conductor plate layer C2 is larger than and encloses the underlying first conductor plate layer C1, the fourth conductor plate layer C4 is larger than and encloses the underlying third conductor plate layer C3, and the sixth conductor plate layer C6 is larger than and encloses the underlying fifth conductor plate layer C5. To ensure that dummy pads are electrically insulated from the conductor plate layers, each of the dummy pads is spaced apart from the contemporarily formed conductor plate layer by a spacing S. The first dummy pad D1 is spaced apart from the first conductor plate layer C1 by the spacing S. The second dummy pad D2 is spaced apart from the third conductor plate layer C3 by the spacing S. The third dummy pad D3 is spaced apart from the fourth conductor plate layer C4 by the spacing S. The fourth dummy pad D4 is spaced apart from the fifth conductor plate layer C5 by the spacing S. The fifth dummy pad D5 is spaced apart from the sixth conductor plate layer C6 by the spacing S. As the spacing S is substantially uniform across the MIM structure, dimensions of the dummy pads and dimensions of the conductor plate layers have a reciprocal relationship. For example, in FIG. 43, the fourth dummy pad D4 is larger than the fifth dummy pad D5 as the fifth conductor plate layer C5 is smaller than the sixth conductor plate layer C6. A contact via 404 that extends through the dummy pads but is isolated from the conductor plate layers may be referred to as a logic contact via that carries logic signals from a top metal contact feature 402.

FIG. 44 illustrates a 6-layer MIM structure in an odd-number-layer-enclosure configuration. Using the X-direction widths as proxies of the overall area along the X-Y plane, the first conductor plate layer C1 is larger than and encloses the overlying second conductor plate layer C2, the third conductor plate layer C3 is larger than and encloses the overlying fourth conductor plate layer C4, and the fifth conductor plate layer C5 is larger than and encloses the overlying sixth conductor plate layer C6. To ensure that dummy pads are electrically insulated from the conductor plate layers, each of the dummy pads is spaced apart from the contemporarily formed conductor plate layer by a spacing S. The first dummy pad D1 is spaced apart from the first conductor plate layer C1 by the spacing S. The second dummy pad D2 is spaced apart from the third conductor plate layer C3 by the spacing S. The third dummy pad D3 is spaced apart from the fourth conductor plate layer C4 by the spacing S. The fourth dummy pad D4 is spaced apart from the fifth conductor plate layer C5 by the spacing S. The fifth dummy pad D5 is spaced apart from the sixth conductor plate layer C6 by the spacing S. As the spacing S is substantially uniform across the MIM structure, dimensions of the dummy pads and dimensions of the conductor plate layers have a reciprocal relationship. For example, in FIG. 44, the fifth dummy pad D5 is larger than the fourth dummy pad D4 as the fifth conductor plate layer C5 is larger than the sixth conductor plate layer C6. A contact via 404 that extends through the dummy pads but is isolated from the conductor plate layers may be referred to as a logic contact via that carries logic signals from a top metal contact feature 402.

Although not illustrated in separate drawings or described in detail, embodiments of the present disclosure may be applicable to MIM structures with more than 6 conductor plate layers. In other words, the even-number-layer-enclosure configuration, the odd-number-layer-enclosure configuration, and the reciprocal relationship between dummy pads and the contemporarily formed conductor plate layers described above may be implemented in an MIM structure with more than 6 conductor plate layers.

One aspect of the present disclosure involves a device structure. The device structure includes a passivation layer, a first conductor plate layer disposed on the passivation layer, a second conductor plate layer disposed over the first conductor layer, a third conductor plate layer disposed over the second conductor layer, and a fourth conductor plate layer disposed over the third conductor layer. The second conductor plate layer encloses the first conductor plate layer and the fourth conductor plate layer encloses the third conductor plate layer.

In some embodiments, an area of the first conductor plate layer is different from an area of the third conductor plate layer. In some implementations, an area of the first conductor plate layer is substantially similar to an area of the third conductor plate layer. In some instances, an area of the second conductor plate layer is different from an area of the fourth conductor plate layer. In some embodiments, an area of the second conductor plate layer is substantially similar to an area of the fourth conductor plate layer. In some implementations, the first conductor plate layer, the second conductor plate layer, the third conductor plate layer, and the fourth conductor plate layer include titanium nitride or tantalum nitride. In some instances, the device structure may further include a first insulator layer disposed between the first conductor plate layer and the second conductor plate layer, a second insulator layer disposed between the second conductor plate layer and the third conductor plate layer, and a third insulator layer disposed between the third conductor plate layer and the fourth conductor plate layer. In some embodiments, the first insulator layer, the second insulator layer, and the third insulator layer include hafnium oxide, hafnium aluminum oxide, hafnium zirconium oxide, zirconium oxide, zirconium aluminum oxide, aluminum oxide, silicon nitride, or a combination thereof. In some embodiments, the device structure may further include a fifth conductor plate layer disposed over the fourth conductor plate layer. In some implementations, an area of the fifth conductor plate layer is smaller than an area of the third conductor plate layer. In some embodiments, an area of the fifth conductor plate layer is greater than an area of the fourth conductor plate layer.

Another aspect of the present disclosure involves a device structure. The device structure includes a passivation layer, a first conductor plate layer disposed on the passivation layer, a second conductor plate layer disposed over the first conductor layer, a third conductor plate layer disposed over the second conductor layer, and a fourth conductor plate layer disposed over the third conductor layer. A vertical projection area of an outer edge of the second conductor plate layer falls completely within a vertical projection area of an outer edge of the first conductor plate layer. A vertical projection area of an outer edge of the fourth conductor plate layer falls completely within a vertical projection area of an outer edge of the third conductor plate layer.

In some embodiments, the vertical projection area of the outer edge of the third conductor plate layer falls completely within the vertical projection area of the outer edge of the first conductor plate layer and the vertical projection area of the outer edge of the fourth conductor plate layer falls completely within the vertical projection area of the outer edge of the second conductor plate layer. In some implementations, the vertical projection area of the outer edge of the third conductor plate layer substantially aligns with the vertical projection area of the outer edge of the first conductor plate layer and the vertical projection area of the outer edge of the fourth conductor plate layer substantially aligns with the vertical projection area of the outer edge of the second conductor plate layer. In some instances, the first conductor plate layer, the second conductor plate layer, the third conductor plate layer, and the fourth conductor plate layer include titanium nitride or tantalum nitride. In some embodiments, the device structure may further include a first insulator layer disposed between the first conductor plate layer and the second conductor plate layer, a second insulator layer disposed between the second conductor plate layer and the third conductor plate layer, and a third insulator layer disposed between the third conductor plate layer and the fourth conductor plate layer.

Still another aspect of the present disclosure involves a device structure. The device structure includes a first passivation layer, a first conductor plate layer disposed on the first passivation layer, a second conductor plate layer disposed over the first conductor layer, a third conductor plate layer disposed over the second conductor layer, a fourth conductor plate layer disposed over the third conductor layer, a second passivation layer disposed over the fourth conductor plate layer, a first dummy pad, a second dummy pad disposed over the first dummy pad, and a third dummy pad disposed over the second dummy pad, and a contact via extending through the first passivation, the first conductor plate layer, the second conductor plate layer, the third conductor plate layer, the fourth conductor plate layer, and the second passivation. The contact via further extends through the first dummy pad, the second dummy pad and the third dummy pad. A vertical projection area of an outer edge of the third dummy pad falls completely within a vertical projection area of an outer edge of the second dummy pad and a vertical projection area of an outer edge of the first dummy pad falls completely within the vertical projection area of the outer edge of the second dummy pad.

In some embodiments, a vertical projection area of an outer edge of the second conductor plate layer falls completely within a vertical projection area of an outer edge of the first conductor plate layer and a vertical projection area of an outer edge of the fourth conductor plate layer falls completely within a vertical projection area of an outer edge of the third conductor plate layer. In some implementations, the contact via, the first dummy pad, the second dummy pad, and the third dummy pad are electrically isolated from the first conductor plate layer, the second conductor plate layer, the third conductor plate layer, and the fourth conductor plate layer. In some embodiments, the first conductor plate layer, the second conductor plate layer, the third conductor plate layer, the fourth conductor plate layer, the first dummy pad, the second dummy pad, and the third dummy pad include titanium nitride or tantalum nitride.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device structure, comprising:
- a contact feature disposed in a first dielectric layer;
- a second dielectric layer over the contact feature and the first dielectric layer;
- a metal-insulator-metal (MIM) structure disposed over the second dielectric layer; and
- a third dielectric layer over the MIM structure,
- wherein the MIM structure comprises:
  - a first conductor plate layer,
  - a first dummy plate spaced apart from the first conductor plate layer by a spacing S,
  - a second conductor plate layer over the first conductor plate layer,
  - a third conductor plate layer over the second conductor plate layer,
  - a second dummy plate over the first dummy plate and spaced apart from the third conductor plate layer by the spacing S,
  - a fourth conductor plate layer over the third conductor plate layer,
  - a third dummy plate over the second dummy plate and spaced apart from the fourth conductor plate layer by the spacing S,
  - a fifth conductor plate layer over the fourth conductor plate layer, and
  - a fourth dummy plate over the third dummy plate and spaced apart from the fifth conductor plate layer by the spacing S,
- wherein the second conductor plate layer encloses the first conductor plate layer,
- wherein the fourth conductor plate layer encloses the third conductor plate layer,
- wherein the fourth conductor plate layer is larger than the fifth conductor plate layer.

2. The device structure of claim 1, further comprising:
- a first insulator layer disposed between the first conductor plate layer and the second conductor plate layer;
- a second insulator layer disposed between the second conductor plate layer and the third conductor plate layer;
- a third insulator layer disposed between the third conductor plate layer and the fourth conductor plate layer; and
- a fourth insulator layer disposed between the fourth conductor plate layer and the fifth conductor plate layer.

3. The device structure of claim 1, wherein an area of the second dummy plate is greater than an area of the first dummy plate.

4. The device structure of claim 1, wherein an area of the fourth dummy plate is greater than an area of the third dummy plate.

5. The device structure of claim 1, further comprising:

a contact via extending through the third dielectric layer, the fourth dummy plate, the third dummy plate, the second dummy plate, the first dummy plate, and the second dielectric layer to couple to the contact feature.

6. The device structure of claim 1, wherein the first conductor plate layer, the second conductor plate layer, the third conductor plate layer, the fourth conductor plate layer, the fifth conductor plate layer, the first dummy plate, the second dummy plate, the third dummy plate, and the fourth dummy plate comprise titanium nitride or tantalum nitride.

7. The device structure of claim 2, wherein the first insulator layer, the second insulator layer, the third insulator layer, and the fourth insulator layer comprise hafnium oxide, hafnium aluminum oxide, hafnium zirconium oxide, zirconium oxide, zirconium aluminum oxide, or a combination thereof.

8. The device structure of claim 1, further comprising:

a sixth conductor plate layer disposed over the fifth conductor plate layer; and a fifth dummy plate disposed over the fourth dummy plate and spaced apart from the sixth conductor plate layer by the spacing S.

9. The device structure of claim 8, wherein the sixth conductor plate layer encloses the fifth conductor plate layer.

10. The device structure of claim 8, wherein an area of the fifth dummy plate is greater than an area of the fourth dummy plate.

11. A device structure, comprising:

a contact feature disposed in a first dielectric layer;

a protective layer over the contact feature and the first dielectric layer;

a second dielectric layer over the protective layer;

a metal-insulator-metal (MIM) structure disposed over the second dielectric layer; and a third dielectric layer over the MIM structure, wherein the MIM structure comprises:

a first conductor plate layer, a first dummy plate spaced apart from the first conductor plate layer by a spacing S, a second conductor plate layer over the first conductor plate layer, a third conductor plate layer over the second conductor plate layer, a second dummy plate over the first dummy plate and spaced apart from the third conductor plate layer by the spacing S, a fourth conductor plate layer over the third conductor plate layer, a third dummy plate over the second dummy plate and spaced apart from the fourth conductor plate layer by the spacing S, a fifth conductor plate layer over the fourth conductor plate layer, and a fourth dummy plate over the third dummy plate and spaced apart from the fifth conductor plate layer by the spacing S, wherein an area of the second conductor plate layer is greater than an area of the first conductor plate layer, wherein an area of the fourth conductor plate layer is greater than an area of the third conductor plate layer, wherein an area of the fourth conductor plate layer is greater than an area the fifth conductor plate layer.

12. The device structure of claim 11, wherein the protective layer comprises silicon carbonitride (SiCN), silicon nitride (SiN), wherein the second dielectric layer and the third dielectric layer comprise undoped silica glass (USG).

13. The device structure of claim 11, wherein the first conductor plate layer, the second conductor plate layer, the third conductor plate layer, the fourth conductor plate layer, the fifth conductor plate layer, the first dummy plate, the second dummy plate, the third dummy plate, and the fourth dummy plate comprise titanium nitride or tantalum nitride.

14. The device structure of claim 11, further comprising:

a contact via extending through the third dielectric layer, the fourth dummy plate, the third dummy plate, the second dummy plate, the first dummy plate, the second dielectric layer, and the protective layer to couple to the contact feature.

15. The device structure of claim 11, wherein an area of the second dummy plate is greater than an area of the first dummy plate, wherein an area of the fourth dummy plate is greater than an area of the third dummy plate.

16. A device structure, comprising:

a contact feature disposed in a first dielectric layer;

a second dielectric layer over the contact feature and the first dielectric layer;

a metal-insulator-metal (MIM) structure disposed over the second dielectric layer, wherein the MIM structure comprises:

a first conductor plate layer, a first dummy plate spaced apart from the first conductor plate layer by a spacing S, a second conductor plate layer over the first conductor plate layer, a third conductor plate layer over the second conductor plate layer, a second dummy plate over the first dummy plate and spaced apart from the third conductor plate layer by the spacing S, a fourth conductor plate layer over the third conductor plate layer, a third dummy plate over the second dummy plate and spaced apart from the fourth conductor plate layer by the spacing S, a fifth conductor plate layer over the fourth conductor plate layer, and a fourth dummy plate over the third dummy plate and spaced apart from the fifth conductor plate layer by the spacing S;

a third dielectric layer over the MIM structure; and a contact via extending through the third dielectric layer, the fourth dummy plate, the third dummy plate, the second dummy plate, the first dummy plate, and the second dielectric layer to couple to the contact feature, wherein the second conductor plate layer encloses the first conductor plate layer, wherein the fourth conductor plate layer encloses the third conductor plate layer, and wherein the fourth conductor plate layer is larger than the fifth conductor plate layer.

17. The device structure of claim 16, further comprising:

a first insulator layer disposed between the first conductor plate layer and the second conductor plate layer;

a second insulator layer disposed between the second conductor plate layer and the third conductor plate layer;

a third insulator layer disposed between the third conductor plate layer and the fourth conductor plate layer; and a fourth insulator layer disposed between the fourth conductor plate layer and the fifth conductor plate layer.

18. The device structure of claim 17, wherein the contact via also extends through the first insulator layer, the second insulator layer, the third insulator layer, and the fourth insulator layer.

19. The device structure of claim 17, wherein the first insulator layer, the second insulator layer, the third insulator layer, and the fourth insulator layer comprise hafnium oxide, hafnium aluminum oxide, hafnium zirconium oxide, zirconium oxide, zirconium aluminum oxide, or a combination thereof.

20. The device structure of claim 17, wherein the first conductor plate layer, the second conductor plate layer, the third conductor plate layer, the fourth conductor plate layer, the fifth conductor plate layer, the first dummy plate, the second dummy plate, the third dummy plate, and the fourth dummy plate comprise titanium nitride or tantalum nitride.

* * * * *